US012796509B2

(12) United States Patent
Itoh

(10) Patent No.: US 12,796,509 B2
(45) Date of Patent: Nov. 10, 2026

(54) SEMICONDUCTOR UNIT AND SEMICONDUCTOR DEVICE

(71) Applicant: FUJI ELECTRIC CO., LTD., Kawasaki (JP)

(72) Inventor: Taichi Itoh, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 688 days.

(21) Appl. No.: 17/994,116

(22) Filed: Nov. 25, 2022

(65) Prior Publication Data

US 2023/0087499 A1 Mar. 23, 2023

Related U.S. Application Data

(63) Continuation of application No. PCT/JP2021/040283, filed on Nov. 1, 2021.

(30) Foreign Application Priority Data

Dec. 21, 2020 (JP) ................................ 2020-210958

(51) Int. Cl.
*H10W 70/65* (2026.01)
*H10W 72/00* (2026.01)
(Continued)

(52) U.S. Cl.
CPC ......... *H10W 70/658* (2026.01); *H10W 90/00* (2026.01); *H10W 72/07552* (2026.01);
(Continued)

(58) Field of Classification Search
None
See application file for complete search history.

(56) References Cited

U.S. PATENT DOCUMENTS

| | | | | |
|---|---|---|---|---|
| 10,727,213 B2 | 7/2020 | Nakashima et al. | | |
| 2009/0290398 A1* | 11/2009 | Kanie .................. | H02M 7/003 363/132 | |

(Continued)

FOREIGN PATENT DOCUMENTS

| | | |
|---|---|---|
| DE | 112019000595 T5 | 11/2020 |
| EP | 2124325 A2 | 11/2009 |

(Continued)

OTHER PUBLICATIONS

Japanese Patent Office Action issued on Mar. 11, 2025, for corresponding Japanese Patent Application No. 2024-028773.

(Continued)

*Primary Examiner* — Dale E Page
*Assistant Examiner* — Rohit Parthasarathy
(74) *Attorney, Agent, or Firm* — Rabin & Berdo, P.C.

(57) ABSTRACT

A semiconductor unit includes a plurality of semiconductor chips, and an insulated circuit board including an insulating plate having, in a plan view of the semiconductor unit, a rectangular shape surrounded by first and second sides opposite to each other and third and fourth sides perpendicular to the first and second sides and opposite to each other, an output circuit pattern and an input circuit pattern on a front surface of the insulating plate. The output and input circuit patterns each extend from the third side to the fourth side, and disposed in this order side by side in a main current direction that is a direction from the first side toward the second side. The plurality of semiconductor chips are bonded to the input circuit pattern at an area extending from the third side to the fourth side and including a center of the third and fourth sides.

26 Claims, 17 Drawing Sheets

(51) Int. Cl.
*H10W 72/50* (2026.01)
*H10W 90/00* (2026.01)

(52) U.S. Cl.
CPC ........ *H10W 72/521* (2026.01); *H10W 72/527* (2026.01); *H10W 72/5445* (2026.01); *H10W 90/753* (2026.01); *H10W 90/754* (2026.01)

(56) References Cited

U.S. PATENT DOCUMENTS

| | | | | |
|---|---|---|---|---|
| 2012/0001308 | A1* | 1/2012 | Fukutani | H10W 70/421<br>438/123 |
| 2014/0124915 | A1* | 5/2014 | Hayashi | H10W 40/22<br>257/713 |
| 2016/0172995 | A1* | 6/2016 | Obiraki | H02M 7/003<br>361/728 |
| 2016/0190915 | A1* | 6/2016 | Horiuchi | H02H 7/122<br>363/132 |
| 2016/0351505 | A1* | 12/2016 | Tamada | H02M 1/088 |
| 2016/0358895 | A1* | 12/2016 | Nakashima | H10D 62/8303 |
| 2017/0077044 | A1* | 3/2017 | Soyano | H02M 7/003 |
| 2018/0182694 | A1* | 6/2018 | Soyano | G01R 33/0047 |
| 2018/0211938 | A1* | 7/2018 | Tsuyuno | H02M 7/003 |
| 2019/0237448 | A1* | 8/2019 | Nakashima | H02M 7/003 |
| 2020/0185359 | A1* | 6/2020 | Nakashima | H02M 1/088 |
| 2020/0266240 | A1* | 8/2020 | Morisaki | H02M 7/48 |
| 2020/0303362 | A1 | 9/2020 | Hoya | |
| 2020/0395343 | A1* | 12/2020 | Kakefu | H02M 7/003 |
| 2022/0311431 | A1* | 9/2022 | Nakashima | H02M 1/0038 |

FOREIGN PATENT DOCUMENTS

| | | | |
|---|---|---|---|
| EP | 2725609 | A1 | 4/2014 |
| EP | 2998992 | A2 | 3/2016 |
| EP | 3573096 | A1 | 11/2019 |
| JP | H08-78620 | A | 3/1996 |
| JP | 2003-142689 | A | 5/2003 |
| JP | 2009-284604 | A | 12/2009 |
| JP | 2012-186910 | A | 9/2012 |
| JP | 2017005212 | A | 1/2017 |
| JP | 2020155557 | A | 9/2020 |
| JP | 2021-019094 | A | 2/2021 |
| WO | 2013/002249 | A1 | 1/2013 |
| WO | 2016/084622 | A1 | 6/2016 |
| WO | 2017/163583 | A1 | 9/2017 |
| WO | 2018/056213 | A1 | 3/2018 |
| WO | 2020/059285 | A1 | 3/2020 |

OTHER PUBLICATIONS

International Search Report for PCT/JP2021/040283, mailed on Jan. 25, 2022.
Written Opinion for PCT/JP2021/040283, mailed on Jan. 25, 2022.
1st Office Action issued for for corresponding DE Patent Application No. 112021001990.2, with English translation, dated Feb. 23, 2026.
Office Action issued for corresponding CN Patent Application No. 202180039127.2, and its English translation, dated Jul. 11, 2026.

* cited by examiner

SEMICONDUCTOR UNIT AND SEMICONDUCTOR DEVICE

CROSS-REFERENCE TO RELATED APPLICATION

This application is a continuation application of International Application PCT/JP2021/040283 filed on Nov. 1, 2021, which designated the U.S., which claims priority to Japanese Patent Application No. 2020-210958, filed on Dec. 21, 2020, the entire contents of which are incorporated herein by reference.

BACKGROUND OF THE INVENTION

1. Field of the Invention

The embodiments discussed herein relate to a semiconductor unit and a semiconductor device.

2. Background of the Related Art

A semiconductor device includes power devices. The power devices are, for example, semiconductor chips, each of which includes an insulated gate bipolar transistor (IGBT) or a power metal-oxide-semiconductor field-effect transistor (MOSFET). The semiconductor device includes a ceramic circuit board on which the above semiconductor chips are disposed. The ceramic circuit board includes a ceramic plate and a plurality of circuit patterns formed on the front surface of the ceramic plate. Circuit patterns corresponding to an upper arm and circuit patterns corresponding to a lower arm are formed on a single ceramic circuit board. The semiconductor chips are suitably mounted on the plurality of circuit patterns. The control electrodes and main electrodes of the semiconductor chips are suitably and electrically connected to the circuit patterns on the ceramic circuit board by bonding wires. In this way, the semiconductor device realizes its desired function (see, for example, International Publication Pamphlet No. WO 2016/084622).

In the case of the above semiconductor device, the circuit patterns corresponding to the upper arm and the circuit patterns corresponding to the lower arm need to be formed on the ceramic plate, with a predetermined distance therebetween. In this way, it is possible to prevent short-circuiting between the circuit patterns corresponding to the upper arm and the circuit patterns corresponding to the lower arm. However, because a predetermined distance needs to be maintained between these sets of circuit patterns, the mounting areas of the circuit patterns on the ceramic plate are reduced, and downsizing of the ceramic plate becomes difficult. Thus, downsizing of the semiconductor device also becomes difficult.

SUMMARY OF THE INVENTION

According to an aspect, there is provided a semiconductor unit, including: a plurality of semiconductor chips, each of which has an output electrode and a control electrode on a front surface thereof and an input electrode on a rear surface thereof; and an insulated circuit board, including an insulating plate having, in a plan view of the semiconductor unit, a rectangular shape surrounded by a first side and a second side which are opposite to each other and a third side and a fourth side which are perpendicular to the first side and the second side and which are opposite to each other, an output circuit pattern provided on a front surface of the insulating plate, and an input circuit pattern which is provided on the front surface of the insulating plate and to which the rear surfaces of the plurality of semiconductor chips are bonded, wherein the output circuit pattern and the input circuit pattern each extend from the third side to the fourth side, and the input circuit pattern and the output circuit pattern are disposed in this order side by side in a main current direction that is a direction from the first side toward the second side, and wherein the plurality of semiconductor chips are bonded to the input circuit pattern in an area that extends from the third side to the fourth side and includes a center of the third and fourth sides.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
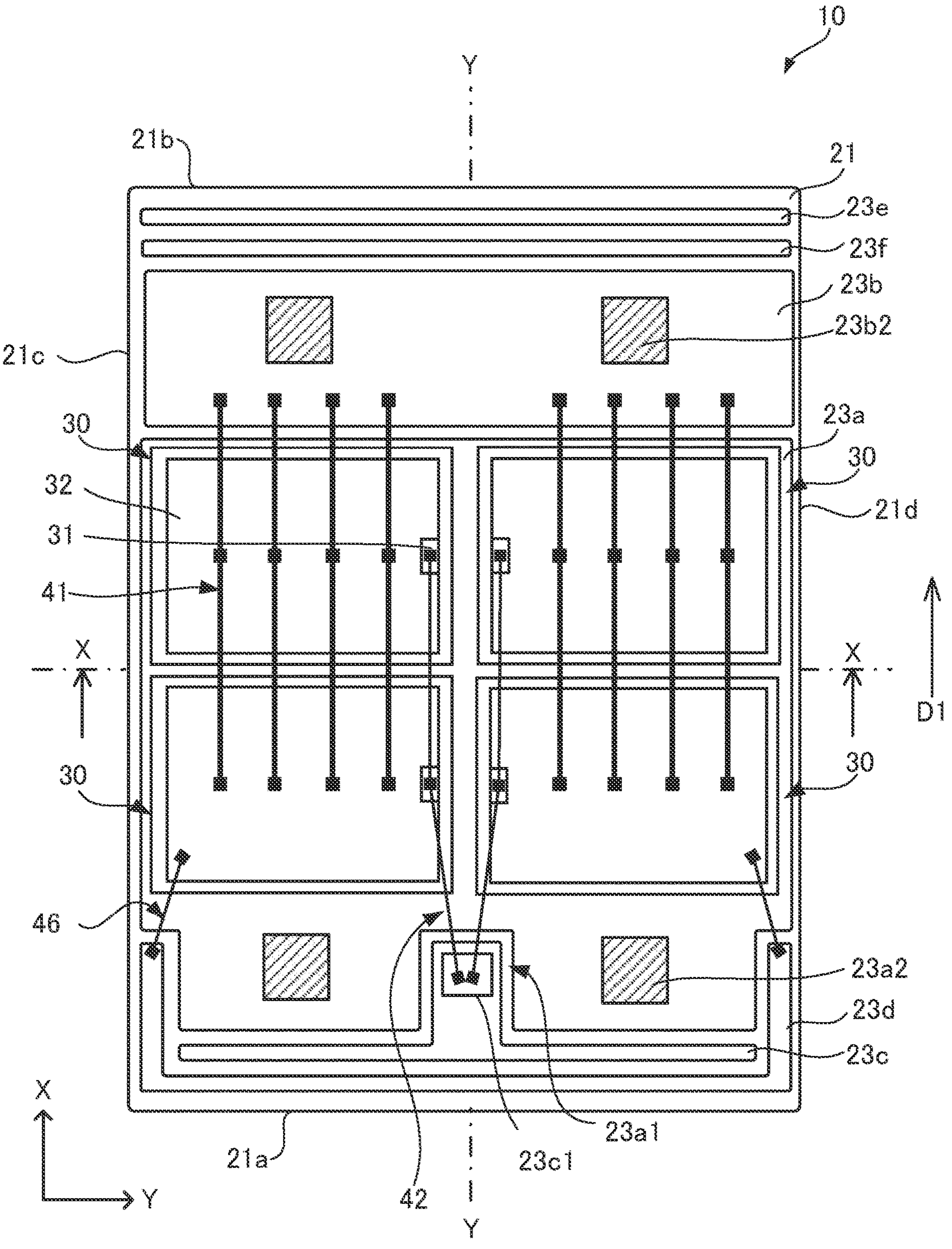
FIG. 1 is a plan view of a semiconductor unit included in a semiconductor device according to a first embodiment.

Hereinafter, embodiments will be described with reference to the accompanying drawings. In the following description, regarding a semiconductor unit 10 in FIG. 1, terms “front surface” and “top surface” each mean a surface facing in the +Z direction. Likewise, regarding the semiconductor unit 10 in FIG. 1, a term “up” means the +Z direction. In addition, regarding the semiconductor unit 10 in FIG. 1, terms “rear surface” and “bottom surface” each mean a surface facing in the −Z direction (no rear surfaces are illustrated in FIG. 1). Likewise, regarding the semiconductor unit 10 in FIG. 1, a term “down” means the −Z direction. Regarding the semiconductor unit 10, a term “side surface” means a surface connecting a “front surface” or a “top surface” and a “rear surface” or a “bottom surface”. For example, regarding the semiconductor unit 10 in FIG. 1, a “side surface” means a surface facing in one of the +X directions and the ±Y directions. In the other drawings, too, the above terms mean their respective directions, as needed. The terms “front surface”, “top surface”, “up”, “rear surface”, “bottom surface”, “down”, and “side surface” are only expressions used for the purpose of convenience to determine relative positional relationships and do not limit the technical concept of the embodiments. For example, the terms “up” and “down” may mean directions other than the vertical directions with respect to the ground. That is, the directions expressed by “up” and “down” are not limited to the directions relating to the gravitational force. In the following description, when a component contained in material represents 80 vol % or more of the material, this component will be referred to as the “main component” of the material.

First Embodiment

Figure 2:
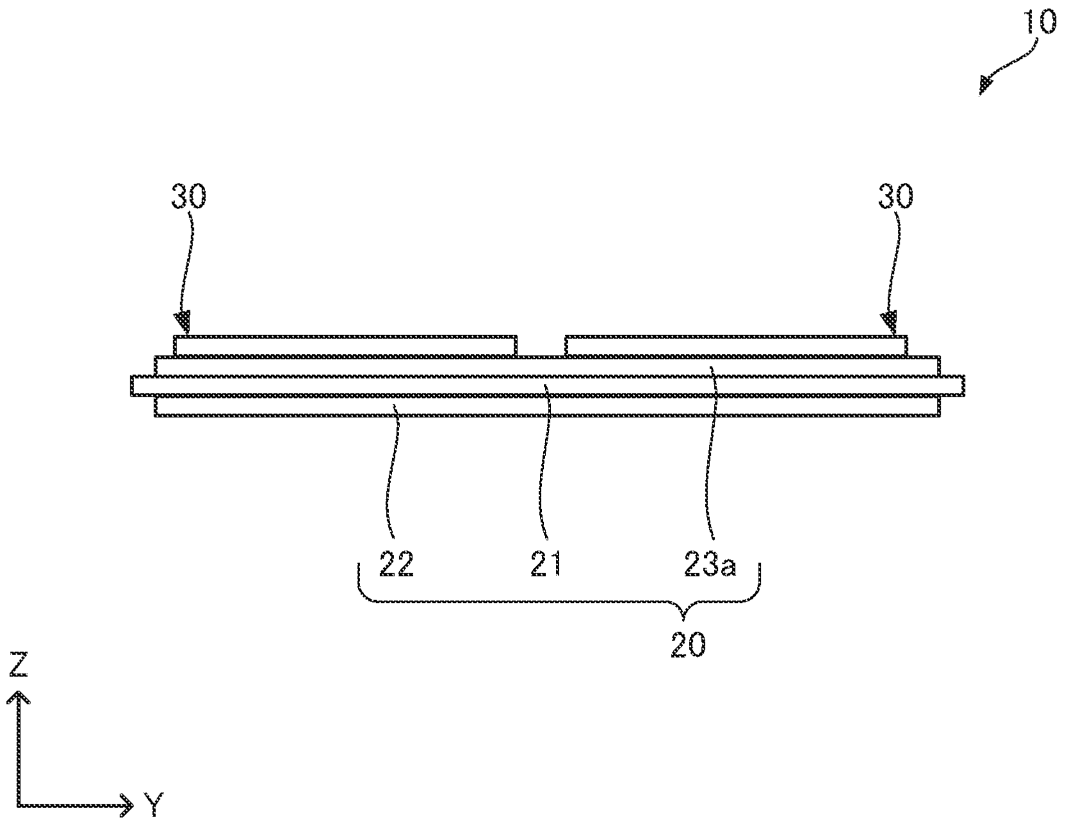
FIG. 2 is a sectional view of the semiconductor unit included in the semiconductor device according to the first embodiment.
Figure 3:
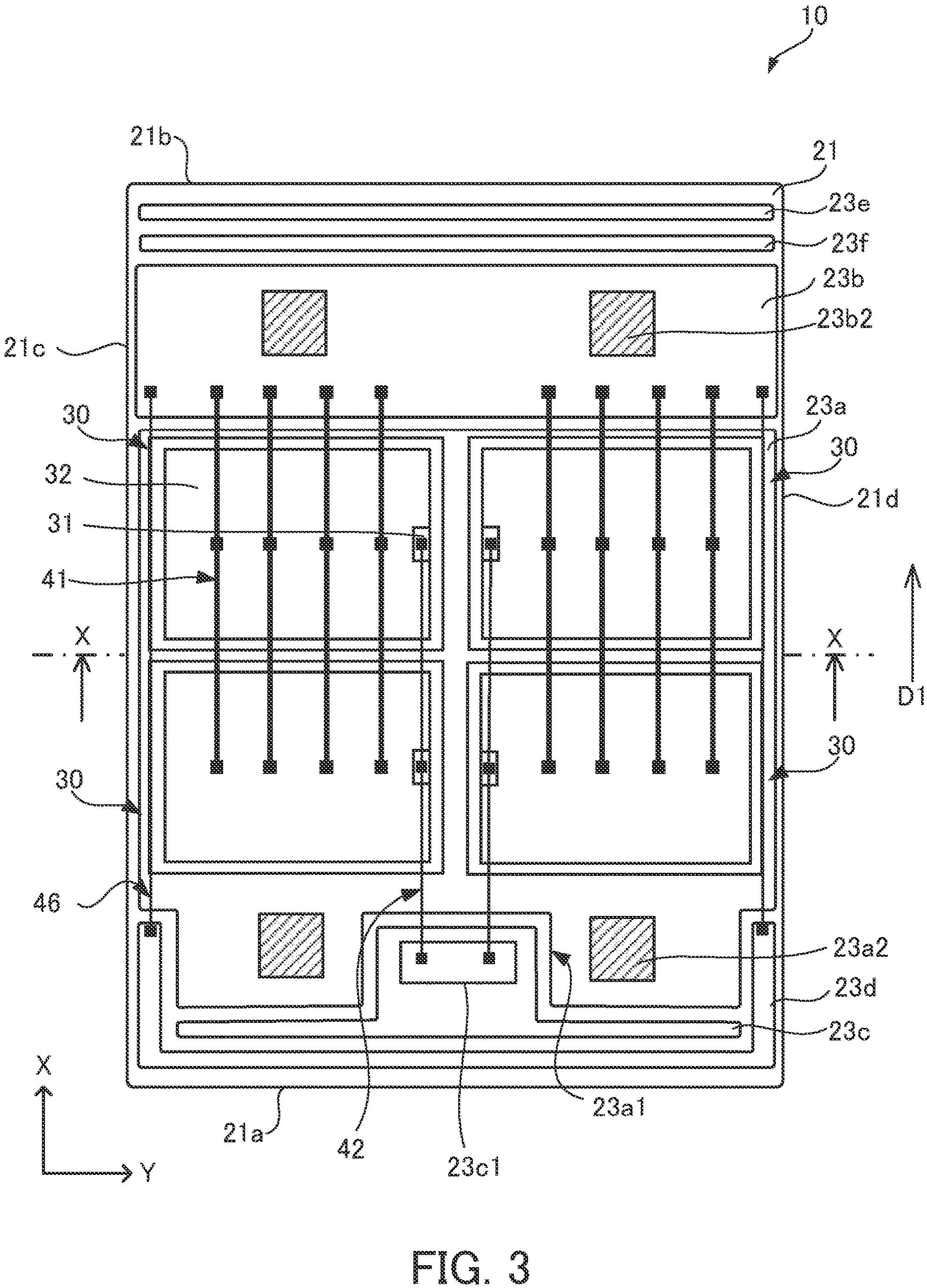
FIG. 3 is a plan view of another semiconductor unit included in the semiconductor device according to the first embodiment.

Hereinafter, a semiconductor device according to a first embodiment will be described with reference to FIGS. 1 to 3. FIG. 1 is a plan view of a semiconductor unit included in a semiconductor device according to a first embodiment, and FIG. 2 is a sectional view of the semiconductor unit included in the semiconductor device according to the first embodiment. In addition, FIG. 3 is a plan view of another semiconductor unit included in the semiconductor device according to the first embodiment. FIG. 2 is a sectional view taken along a dashed-dotted line X-X in FIG. 1.

As will be described below, the semiconductor device includes two semiconductor units 10, one of which is illustrated in FIGS. 1 and 2. Each semiconductor unit 10 includes a ceramic circuit board 20 (an insulated circuit board) and semiconductor chips 30 formed on the front surface of the ceramic circuit board 20.

The individual semiconductor chip 30 is made of silicon or silicon carbide as its main component. The individual semiconductor chip 30 includes a reverse-conducting (RC)-IGBT as a switching element. The RC-IGBT is structured by connecting an IGBT and a free-wheeling diode (FWD) in reverse-parallel to each other on a single chip. The individual semiconductor chip 30 includes a control electrode 31 (a gate electrode) and an output electrode 32 (the emitter electrode of the IGBT portion and the cathode electrode of the FWD portion) on its front surface. The individual semiconductor chip 30 has a rectangular shape in The control electrode 31 of the individual plan view. semiconductor chip 30 is located at a center portion of one side of the front surface of this semiconductor chip 30. The output electrode 32 of the individual semiconductor chip 30 is formed in an area of the front surface of this semiconductor chip 30, the area being other than the area where the control electrode 31 is formed. In addition, the individual semiconductor chip 30 includes an input electrode not illustrated (the collector electrode of the IGBT portion and the anode electrode of the FWD portion) on its rear surface. The control electrodes 31 of the four semiconductor chips 30 are located in an inner area of the semiconductor unit 10, and one of the control electrodes 31 faces other control electrodes 31. In addition, the rear surfaces of the four semiconductor chips 30 are bonded to the circuit pattern 23*a*. The number of semiconductor chips 30 and the locations of the semiconductor chips 30 are not limited to those described above.

The ceramic circuit board 20 has a rectangular shape in plan view. The ceramic circuit board 20 has a ceramic plate 21 and a metal plate 22, which is formed on the rear surface of the ceramic plate 21. In addition, the ceramic circuit board 20 has circuit patterns 23*a* to 23*f* on the front surface of the ceramic plate 21. The ceramic plate 21 and the metal plate 22 each have a rectangular shape in plan view. In addition, the ceramic plate 21 and the metal plate 22 may be formed to have rounded or chamfered corners. In plan view, the metal plate 22 is smaller than the ceramic plate 21 and is formed inside the ceramic plate 21.

The ceramic plate 21 has, in plan view, a rectangular shape surrounded by first and second sides 21*a* and 21*b* which are located in opposite directions (the +X directions) and third and fourth sides 21*c* and 21*d* which are perpendicular to the first and second sides 21*a* and 21*b* and which are located in opposite directions (the ±Y directions). The ceramic plate 21 may have, in plan view, a rectangular shape surrounded by the first and second sides 21*a* and 21*b* formed as its long sides and the third and fourth sides 21*c* and 21*d* formed as its short sides. When this ceramic plate 21 is used, the direction (the +X direction) from the first side 21*a* near which input terminal areas 23*a*2 to be described below are formed to the second side 21*b* near which output terminal areas 23*b*2 to be described below are formed will be referred to as a main current direction D1. The ceramic plate 21 is made of ceramic material having good thermal conductivity as its component. For example, this ceramic material constituting the ceramic plate 21 contains, as its main component, a composite material of aluminum oxide and zirconium oxide added thereto. Alternatively, the ceramic material contains material containing silicon nitride as its main component. The ceramic plate 21 has a thickness between 0.2 mm and 2.5 mm, inclusive.

The metal plate 22 is made of metal material having excellent thermal conductivity as its main component. Examples of the metal material include aluminum, iron, silver, copper, and an alloy containing at least one of these kinds. The thickness of the metal plate 22 is between 0.1 mm and 5.0 mm, inclusive. The surface of the metal plate 22 may be plated to improve its corrosion resistance. Examples of the plating material include nickel, a nickel-phosphorus alloy, and a nickel-boron alloy.

The circuit patterns 23*a* to 23*f* are each made of metal material having excellent electrical conductivity as its main component. Examples of the metal material include silver, copper, nickel, and an alloy containing at least one of these kinds. In addition, the circuit patterns 23*a* to 23*f* each have a thickness between 0.1 mm and 5.0 mm, inclusive. The surface of each of the circuit patterns 23*a* to 23*f* may be plated to improve its corrosion resistance. Examples of the plating material include nickel, a nickel-phosphorus alloy, and a nickel-boron alloy. The circuit patterns 23*a* to 23*f* are obtained by forming a metal layer on the front surface of the ceramic plate 21 and performing etching or the like on this metal layer. Alternatively, the circuit patterns 23*a* to 23*f* may first be cut out from a metal layer and may next be fixed to the front surface of the ceramic plate 21 by applying pressure. The circuit patterns 23*a* to 23*f* illustrated in FIGS.

1 and 2 are examples. The circuit patterns 23*a* to 23*f* will be described in detail below. Plating may be performed to form plating material on the surface of each of the circuit patterns 23*a* to 23*f*, to improve the corrosion resistance. Examples of the plating material include nickel, a nickel-phosphorus alloy, and a nickel-boron alloy.

For example, a direct copper bonding (DCB) substrate or an active metal brazed (AMB) substrate may be used as the ceramic circuit board 20 having the above structure. The ceramic circuit board 20 transfers the heat generated by the semiconductor chips 30 to the outside via the circuit pattern 23*a*, the ceramic plate 21, and the metal plate 22.

Next, each of the circuit patterns 23*a* to 23*f* will be described in detail. The circuit pattern 23*a* (an input circuit pattern) is mechanically and electrically connected to the input electrodes formed on the rear surfaces of the semiconductor chips 30 via solder. The circuit pattern 23*a* has an approximately rectangular shape and includes a concave portion 23*a*1 in a lower part in FIG. 1. A contact area 23*c*1 to be described below of the circuit pattern 23*c* is located inside this concave portion 23*al*. The circuit pattern 23*a* sandwiches the concave portion 23*al* and includes the two input terminal areas 23*a*2 near the circuit pattern 23*c*.

The circuit pattern 23*a* is formed in an area including a center line (the dashed-dotted line X-X) perpendicular to the main current direction D1. The semiconductor chips 30 are disposed in the area including the center line (the dashed-dotted line X-X). In FIG. 1, two of the four semiconductor chips 30 are disposed above the center line (dashed-dotted line X-X) (in the +X direction) and the other two semiconductor chips 30 are disposed below the center line (in the −X direction). In addition, the four semiconductor chips 30 are disposed symmetrically with respect to a center line (a dashed-dotted line Y-Y) located between the third side 21*c* and the fourth side 21*d* of the ceramic plate 21. The control electrodes 31 of the semiconductor chips 30 are disposed near the center line (the dashed-dotted line Y-Y), and a control electrode 31 is disposed to face another control electrode 31 with the center line (the dashed-dotted line Y-Y) therebetween.

The circuit pattern 23*b* (an output circuit pattern) is mechanically and electrically connected to the output electrodes 32 of the semiconductor chips 30 by main current wires 41 that extend in the main current direction D1. The circuit pattern 23*b* includes the two output terminal areas 23*b*2 near the circuit pattern 23*f*.

These circuit patterns 23*a* and 23*b* are formed to extend from the third side 21*c* to the fourth side 21*d* of the ceramic plate 21. In addition, the circuit patterns 23*a* and 23*b* are formed side by side in this order in the main current direction D1. That is, the circuit patterns 23*a* and 23*b* are formed adjacent to each other in the +X directions, and no other circuit patterns are formed therebetween. In addition, end portions of the circuit patterns 23*a* and 23*b*, the end portions being located in the −Y direction, are formed adjacent to the third side 21*c* of the ceramic plate 21, and no other circuit patterns are formed therebetween. End portions of the circuit patterns 23*a* and 23*b*, the end portions being located in the ±Y direction, are formed adjacent to and face the fourth side 21*d* of the ceramic plate 21, and no circuit patterns are formed therebetween. Thus, a main current that flows to the input terminal areas 23*a*2 of the ceramic circuit board 20 flows in the main current direction D1 and is output from the output terminal areas 23*b*2.

The gap between the circuit patterns 23*a* and 23*b*, the gap between the −Y direction end portions of the circuit patterns 23*a* and 23*b* and the third side 21*c* of the ceramic plate 21, and the gap between the +Y direction end portions of the circuit patterns 23*a* and 23*b* and the fourth side 21*d* of the ceramic plate 21 may each be formed based on a predetermined insulating distance. For example, the gap formed based on a predetermined insulating distance may be between 0.5 mm and 4.0 mm, inclusive.

In addition, for example, each of the ±Y direction end portions of the circuit pattern 23*b* (the output circuit pattern) may be formed adjacent to a corresponding one of the third and fourth sides 21*c* and 21*d*. In the area where the semiconductor chips 30 are disposed, each of the ±Y direction end portions of the circuit pattern 23*a* (the input circuit pattern) may be formed adjacent to a corresponding one of the third and fourth sides 21*c* and 21*d*. In contrast, the circuit pattern 23*c* or 23*d*, e.g., a control circuit or a sense circuit to be described below, may be formed between one of the end portions of the area where the input terminal areas 23*a*2 are disposed, the end portions being located in the +Y direction, and the third side 21*c* or fourth side 21*d*.

The input terminal areas 23*a*2 are disposed near the first side 21*a* of the ceramic circuit board 20, and the output terminal areas 23*b*2 are disposed near the second side 21*b* of the ceramic circuit board 20. That is, the main current direction D1 is the direction from the input terminal areas 23*a*2 to the output terminal areas 23*b*2. The input terminal areas 23*a*2 and the output terminal areas 23*b*2 are equally distanced from the center line (the dashed-dotted line X-X) of the ceramic circuit board 20, the center line being perpendicular to the main current direction D1. In addition, the input terminal areas 23*a*2 and the output terminal areas 23*b*2 are approximately equally distanced from the first and second sides 21*a* and 21*b*, respectively.

The circuit pattern 23*c* (a first control circuit pattern) is electrically connected to the control electrodes 31 of the semiconductor chips 30. The circuit pattern 23*c* is formed outside and adjacent to the circuit pattern 23*a* (on the side opposite to the main current direction D1). In other words, the circuit pattern 23*c* is disposed closer to the first side 21*a* than is the circuit patten 23*a*. The (+Y direction) end portions of the circuit pattern 23*c* are formed to correspond to the width of the area where the input terminal areas 23*a*2 of the circuit pattern 23*a* are formed. That is, there is a gap between the (−Y direction) end portion of the circuit pattern 23*c* and the third side 21*c* of the ceramic plate 21, and there is a gap between the (+Y direction) end portion of the circuit pattern 23*c* and the fourth side 21*d* of the ceramic plate 21. In addition, the circuit pattern 23*c* includes the contact area 23*cl* at a location corresponding to the midpoint between the third and fourth sides 21*c* and 21*d* of the ceramic plate 21. This contact area 23*cl* is located inside the concave portion 23*a*1 of the circuit pattern 23*a*. The circuit pattern 23*c* (the contact area 23*cl*) is mechanically and electrically connected to the control electrodes 31 of the semiconductor chips 30, the control electrodes 31 being located in the inner area of the semiconductor unit 10, by control wires 42 (control wiring members) that extend in the main current direction D1. The circuit pattern 23*f* (a second control circuit pattern) may be electrically connected to the control electrodes 31 of the semiconductor chips 30. The circuit pattern 23*f* has a linear shape and is formed outside and adjacent to the circuit pattern 23*b* (in the main current direction D1). The (±Y direction) end portions of the circuit pattern 23*f* are formed to correspond to the (+Y direction) end portions of the circuit pattern 23*b*.

These circuit patterns 23*c* and 23*f* are formed symmetrically with respect to the center line (the dashed-dotted line X-X) of the ceramic circuit board 20, the center line being perpendicular to the main current direction D1. In addition, the circuit patterns 23*c* and 23*f* are equally distanced from the first and second sides 21*a* and 21*b* of the ceramic plate 21, respectively.

The circuit pattern 23*d* (a first sense circuit pattern) is electrically connected to the output electrodes 32 of the semiconductor chips 30. The circuit pattern 23*d* is formed near the circuit pattern 23*a* on the side opposite to the main current direction D1. The circuit pattern 23*d* is formed outside and adjacent to the circuit pattern 23*c* (in the −X direction). In other words, the circuit pattern 23*d* is closer to the first side 21*a* than is the circuit pattern 23*c*. That is, according to the first embodiment, the circuit pattern 23*d* has a U shape in plan view. Specifically, the circuit pattern 23*d* is formed along the area in which the input terminal areas 23*a*2 of the circuit pattern 23*a* are set, the (±Y direction) end portions of the circuit pattern 23*c*, and a side of the circuit pattern 23*c* on the side opposite to the main current direction D1. Therefore, the circuit pattern 23*d* surrounds the area in which the input terminal areas 23*a*2 of the circuit pattern 23*a* are set and the circuit pattern 23*c*. The circuit pattern 23*d* is mechanically and electrically connected to the output electrodes 32 of the semiconductor chips 30 by sense wires 46 extending in the main current direction D1.

The circuit pattern 23*e* (a second sense circuit pattern) may be electrically connected to the output electrodes 32 of the semiconductor chips 30. The circuit pattern 23*e* has a linear shape and is formed outside and adjacent to the circuit pattern 23*f* (in the main current direction D1). In other words, the circuit pattern 23*e* is closer to the second side 21*b* than is the circuit pattern 23*f*. The (±Y direction) end portions of the circuit pattern 23*e* are formed to correspond to the (±Y direction) end portions of the circuit pattern 23*f*.

In addition, these circuit patterns 23*d* and 23*e* are equally distanced from the center line (the dashed-dotted line X-X) of the ceramic circuit board 20, the center line being perpendicular to the main current direction D1. In addition, the circuit patterns 23*d* and 23*e* are equally distanced from the first and second sides 21*a* and 21*b* of the ceramic plate 21, respectively.

The main current wires 41, the control wires 42, and the sense wires 46 are each made of metal material having excellent electrical conductivity as its main component. Examples of the metal material include gold, silver, copper, aluminum, and an alloy containing at least one of these kinds. The control wires 42 and the sense wires 46 may have a diameter smaller than that of the main current wires 41. In this way, the corresponding bonding areas are reduced, and wiring is easily achieved in fine portions. The control wires 42 and the sense wires 46 each have a diameter between 50 μm and 400 μm, inclusive, and the main current wires 41 each have a diameter between 300 μm and 600 μm, inclusive, for example. Control coupling wires 44*a* and 44*b* and sense coupling wires 45*a* and 45*b* to be described below are also made of the same material as that of the control wires 42 and the sense wires 46. The control coupling wires 44*a* and 44*b* and the sense coupling wires 45*a* and 45*b* may have the same diameter as that of the control wires 42 and the sense wires 46. This diameter may be smaller than that of the main current wires 41.

The control wires 42 and the sense wires 46 may be formed to extend as illustrated in FIG. 3, other than the case illustrated in FIG. 1. The individual control wire 42 connects the contact area 23*cl* of the circuit pattern 23*c* to the control electrodes 31 of the corresponding two semiconductor chips 30 in parallel to the main current direction D1. The individual sense wire 46 connects the circuit patterns 23*b* and 23*d* in parallel to the main current direction D1 near the third side 21*c* or the fourth side 21*d* of the ceramic plate 21. In addition, some of the main current wires 41 extend between one of the control wires 42 and one of the sense wires 46 in parallel to the main current direction D1, and the other main current wires 41 extend between the other control wire 42 and the other sense wire 46 in parallel to the main current direction D1. Because all the main current wires 41, the control wires 42, and the sense wires 46 extend in parallel to the main current direction D1, the bonding of these wires is easily achieved.

In this way, the semiconductor chips 30 and the circuit patterns 23*a*, 23*b*, 23*c*, and 23*d* are connected to each other by the main current wires 41, the control wires 42, and the sense wires 46. By connecting the above components of the semiconductor unit 10, an arm portion is structured. This arm portion functions as an upper arm or a lower arm, depending on the direction of the arm portion (the main current direction D1), which will be described in detail below.

Figure 4:
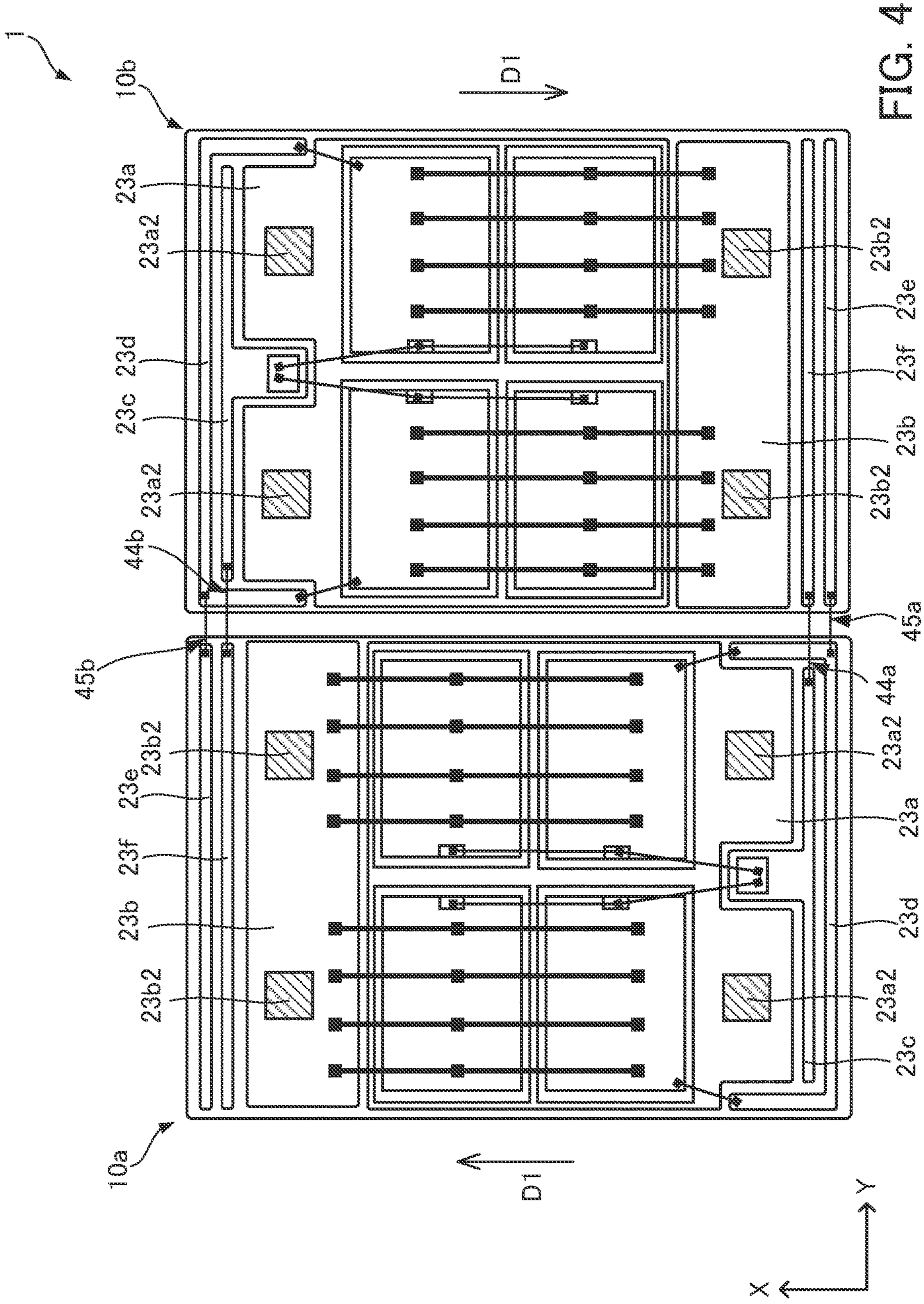
FIG. 4 is a plan view of the semiconductor device according to the first embodiment.
Figure 5:
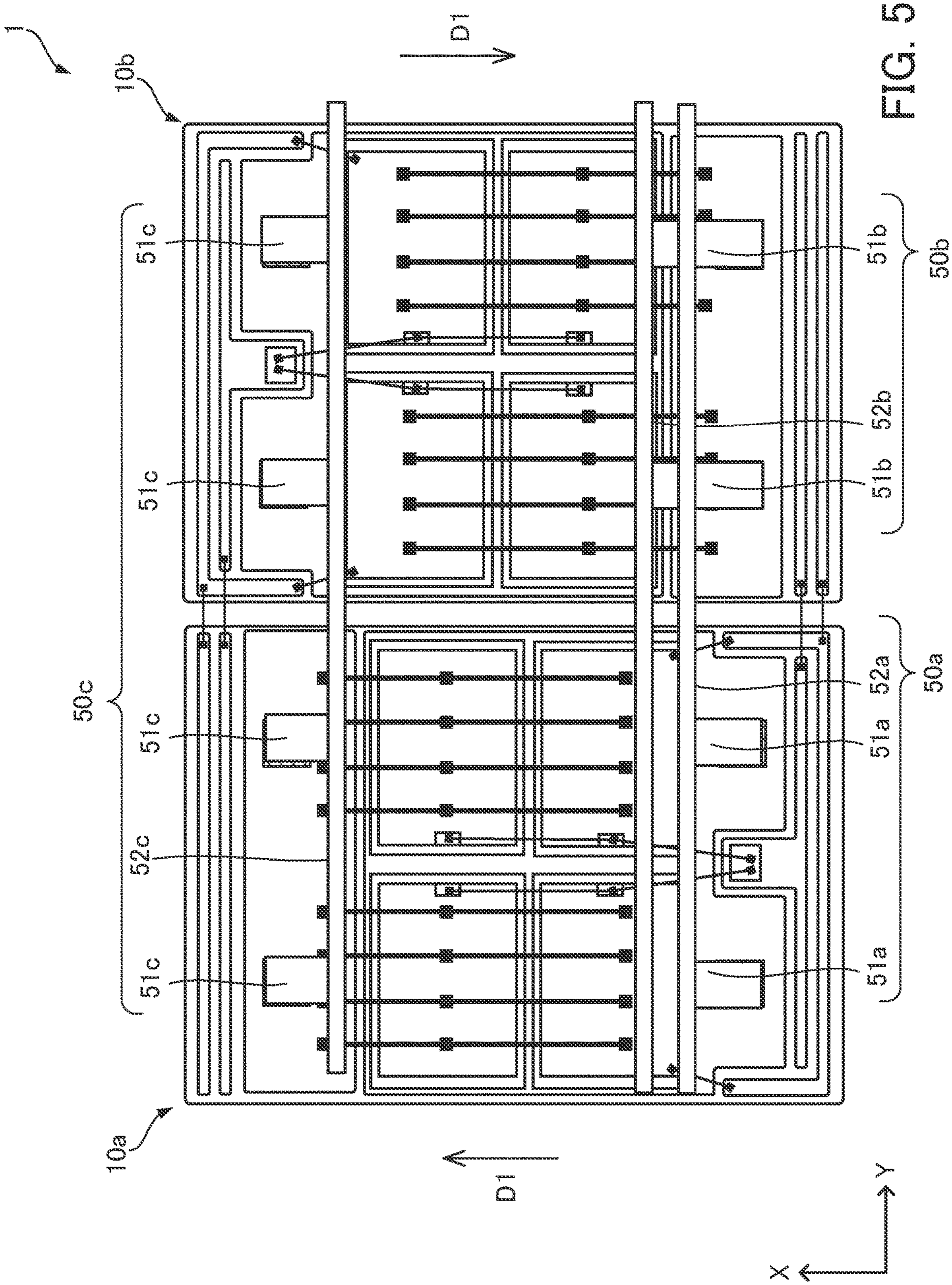
FIG. 5 is another plan view of the semiconductor device according to the first embodiment.
Figure 6:
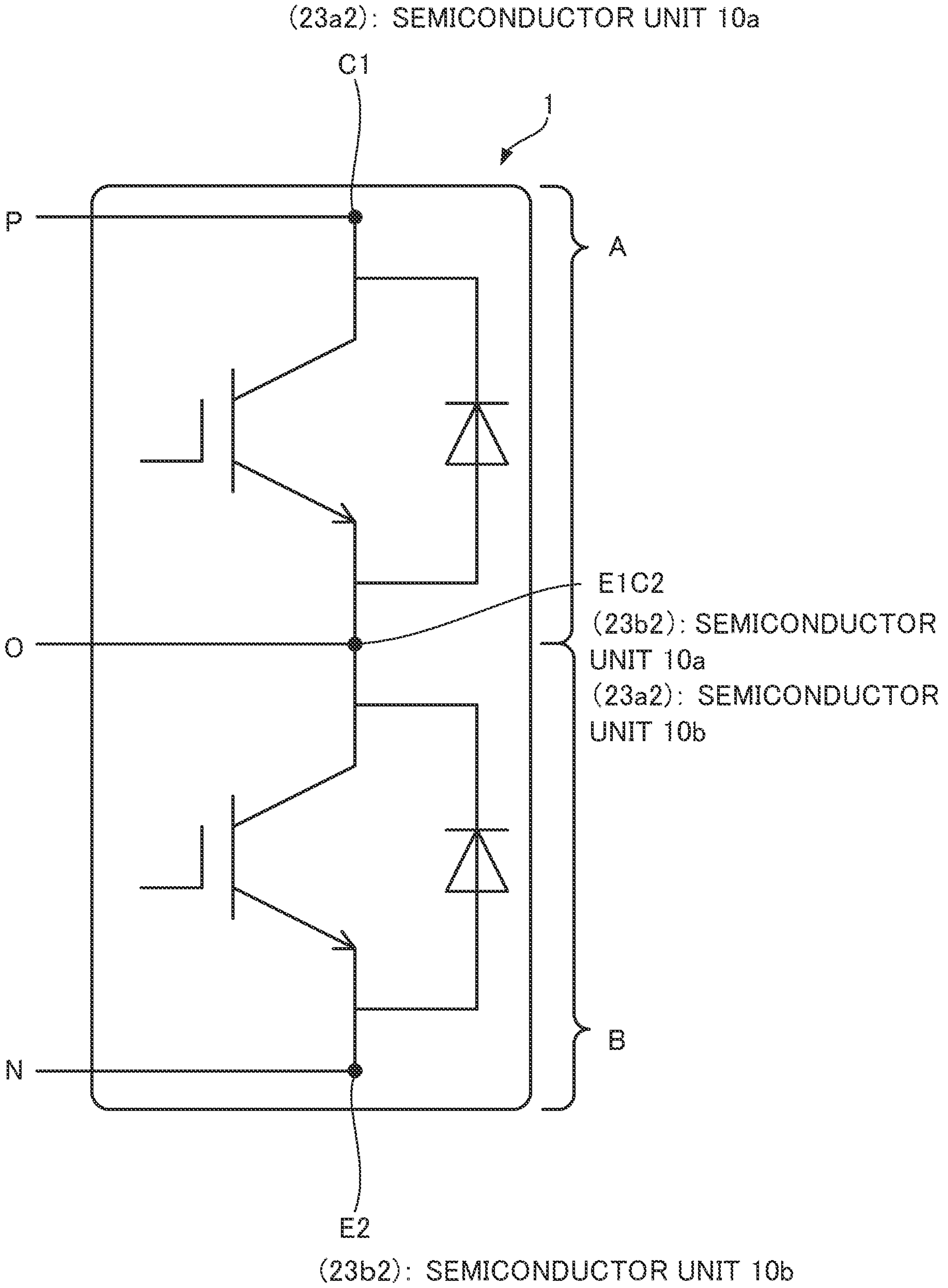
FIG. 6 illustrates an equivalent circuit of the semiconductor device according to the first embodiment.

Next, a semiconductor device including the semiconductor unit 10 as described above will be described with reference to FIGS. 4 to 6. FIGS. 4 and 5 are each a plan view of a semiconductor device according to the first embodiment. FIG. 6 illustrates an equivalent circuit of the semiconductor device according to the first embodiment. In FIGS. 4 to 6, components that need to be described are denoted by reference characters. While there are some components that are not denoted by reference characters, these reference characters are included in FIGS. 1 and 2. The semiconductor device may be e formed by using the semiconductor unit illustrated in FIG. 3.

A semiconductor device 1 includes two semiconductor units 10*a* and 10*b*. The semiconductor unit 10*a* is equivalent to the semiconductor unit 10 and functions as an upper arm. While the semiconductor unit 10*b* is also equivalent to the semiconductor unit 10, the main current direction D1 thereof is opposite to that of the semiconductor unit 10*a*, and the semiconductor unit 10*b* functions as a lower arm. Thus, while the semiconductor units 10*a* and 10*b* each include the same components as those of the semiconductor unit 10, one of the semiconductor units 10*a* and 10*b* is disposed in the opposite direction to the other.

In the case of the semiconductor device 1, the circuit pattern 23*b* of the semiconductor unit 10*a* and the circuit pattern 23*a* of the semiconductor unit 10*b* may be mechanically and electrically connected to each other by a main circuit coupling wire (not illustrated).

In addition, in the case of the semiconductor device 1, the circuit pattern 23*c* of the semiconductor unit 10*a* and the circuit pattern 23*f* of the semiconductor unit 10*b* are mechanically and electrically connected to each other by the control coupling wire 44*a*. The circuit pattern 23*f* of the semiconductor unit 10*a* and the circuit pattern 23*c* of the semiconductor unit 10*b* are mechanically and electrically connected to each other by the control coupling wire 44*b*.

In addition, in the case of the semiconductor device 1, the circuit pattern 23*d* of the semiconductor unit 10*a* and the circuit pattern 23*e* of the semiconductor unit 10*b* are mechanically and electrically connected to each other by the sense coupling wire 45*a*. The circuit pattern 23*e* of the semiconductor unit 10*a* and the circuit pattern 23*d* of the semiconductor unit 10*b* are mechanically and electrically connected to each other by the sense coupling wire 45*b*.

In addition, the semiconductor device 1 includes busbars 50*a* and 50*b*. The busbars 50*a* and 50*b* are each made of metal material having excellent electrical conductivity as its main component. Examples of the metal material include silver, copper, nickel, and an alloy containing at least one of these kinds. The surface of each of the busbars 50*a* and 50*b* may be plated to improve its corrosion resistance. Examples of the plating material include nickel, a nickel-phosphorus alloy, and a nickel-boron alloy.

The busbar 50*a* includes leg portions 51*a* and a wiring portion 52*a*. The leg portions 51*a* are bonded to the input terminal areas 23*a*2 of the circuit pattern 23*a* of the semiconductor unit 10*a*. This bonding of the leg portions 51*a* is performed by soldering or ultrasonic bonding, for example. The wiring portion 52*a* is mechanically connected to the leg portions 51*a*. The wiring portion 52*a* and the leg portions 51*a* may be formed integrally or may be bonded to each other by welding, for example. In addition, the wiring portion 52*a* is perpendicular to the main current direction D1 and extends in the ±Y directions in FIG. 5. In FIG. 5, part of the wiring portion 52*a* is illustrated. The wiring portion 52*a* may be formed to extend in any direction, depending on the design or specifications of the semiconductor device 1.

The busbar 50*b* also includes leg portions 51*b* and a wiring portion 52*b*. The leg portions 51*b* are bonded to the output terminal areas 23*b*2 of the circuit pattern 23*b* of the semiconductor unit 10*b*. This bonding of the leg portions 51*b* is also performed by soldering or ultrasonic bonding, for example. The wiring portion 52*b* is mechanically connected to the leg portions 51*b*. The wiring portion 52*b* and the leg portions 51*b* may be formed integrally or may be bonded to each other by welding, for example. In addition, the wiring portion 52*b* is perpendicular to the main current direction D1 and extends in the ±Y directions in FIG. 5. In FIG. 5, part of the wiring portion 52*b* is illustrated. The wiring portion 52*b* may be formed to extend in any direction, depending on the design or specifications of the semiconductor device 1.

A busbar 50*c* also includes leg portions 51*c* and a wiring portion 52*c*. The leg portions 51*c* are bonded to the output terminal areas 23*b*2 of the circuit pattern 23*b* of the semiconductor unit 10*a* and to the input terminal areas 23*a*2 of the circuit pattern 23*a* of the semiconductor unit 10*b*.

This bonding of the leg portions 51*c* is also performed by soldering or ultrasonic bonding, for example. The wiring portion 52*c* is mechanically connected to the leg portions 51*c*. The wiring portion 52*c* and the leg portions 51*c* may be formed integrally or may be bonded to each other by welding, for example. In addition, the wiring portion 52*c* is perpendicular to the main current direction D1 and extends in the ±Y directions in FIG. 5. In FIG. 5, part of the wiring portion 52*c* is illustrated. The wiring portion 52*c* may be formed to extend in any direction, depending on the design or specifications of the semiconductor device 1.

The semiconductor device 1 constitutes a half-bridge circuit illustrated in FIG. 6 and includes an upper arm A and a lower arm B. In the case of the semiconductor device 1, by connecting the semiconductor units 10*a* and 10*b* to each other, the semiconductor unit 10*a* functions as the upper arm A, and the semiconductor unit 10*b* functions as the lower arm B. In the case of this semiconductor device 1, a connection point C1 connected to a positive electrode P of an external power supply (not illustrated) corresponds to the input terminal areas 23*a*2 of the semiconductor unit 10*a*. A connection point E1C2 connected to a terminal O of a load (not illustrated) corresponds to the output terminal areas 23*b*2 of the semiconductor unit 10*a* and the input terminal areas 23*a*2 of the semiconductor unit 10*b*. A connection point E2 connected to a negative electrode N of the external power supply corresponds to the output terminal areas 23*b*2 of the semiconductor unit 10*b*.

A wiring extends from the connection point C1 to the outside of the semiconductor device 1 via the busbar 50*a* and is connected to the high-potential terminal (P) of the external power supply. A wiring extends from the connection point E2 to the outside of the semiconductor device 1 via the busbar 50*b* and is connected to the low-potential terminal (N) of the external power supply. In addition, a wiring extends from the connection point E1C2 to the outside of the semiconductor device 1 via the busbar 50*c* and is connected to the terminal (O) of the load. The semiconductor units 10 consequently function as an inverter.

The semiconductor device 1 structured by connecting the semiconductor units 10*a* and 10*b* is disposed on a heat dissipation board via solder or silver solder, for example. The heat dissipation board may be a flat plate having a rectangular shape in plan view. The heat dissipation board is made of metal material having excellent thermal conductivity as its main component. Examples of the metal material include aluminum, iron, silver, copper, and an alloy containing at least one of these kinds. Nickel may be formed on the surface of the heat dissipation board by plating or the like, to improve the corrosion resistance. Specifically, examples of the plating material include not only nickel but also a nickel-phosphorus alloy and a nickel-boron alloy. For example, attachment holes are suitably formed in the heat dissipation board as described above, and these attachment holes are used to attach the semiconductor device 1 to an external device.

In addition, a cooling unit may be attached to the rear surface of the heat dissipation board of the semiconductor device 1 via thermal grease. The thermal grease is, for example, silicone in which filler of metal oxide is mixed. This cooling unit is also made of material having excellent thermal conductivity as its main component, and as needed, the surface of the cooling unit may be plated. The cooling unit is, for example, a heat sink having a plurality of fins or a water-cooled cooling device. The heat dissipation board may be formed integrally with such a cooling unit as described above.

The semiconductor device 1 may be sealed with sealing material. The sealing material may seal the front surface of the ceramic circuit board 20, the semiconductor chips 30, and the wires such as the main current wires 41, the control wires 42, and the sense wires 46. The rear surface of the heat dissipation board may be exposed to the outside from the sealing material. The sealing material is thermosetting resin such as epoxy resin or silicone gel. The sealing material may further contain filler.

Alternatively, after stored in a case (not illustrated), the semiconductor device 1 may be sealed with sealing material. As needed, the case may be provided with wiring members. Examples of the wiring members include a lead frame and the busbars 50*a*, 50*b*, and 50*c*. In this case, the control terminals and sense terminals included in the lead frame and the external terminals included in the busbars 50*a*, 50*b*, and 50*c* are exposed to the outside of the case. The individual control terminal receives a control signal, and the individual sense terminal outputs a measured signal. The individual external terminal receives and outputs a predetermined current from and to the outside. The case as described above is made of thermoplastic resin as its main component. Examples of this resin include polyphenylene sulfide resin, polybutylene terephthalate resin, polybutylene succinate resin, polyamide resin, and acrylonitrile butadiene styrene resin.

Figure 7:
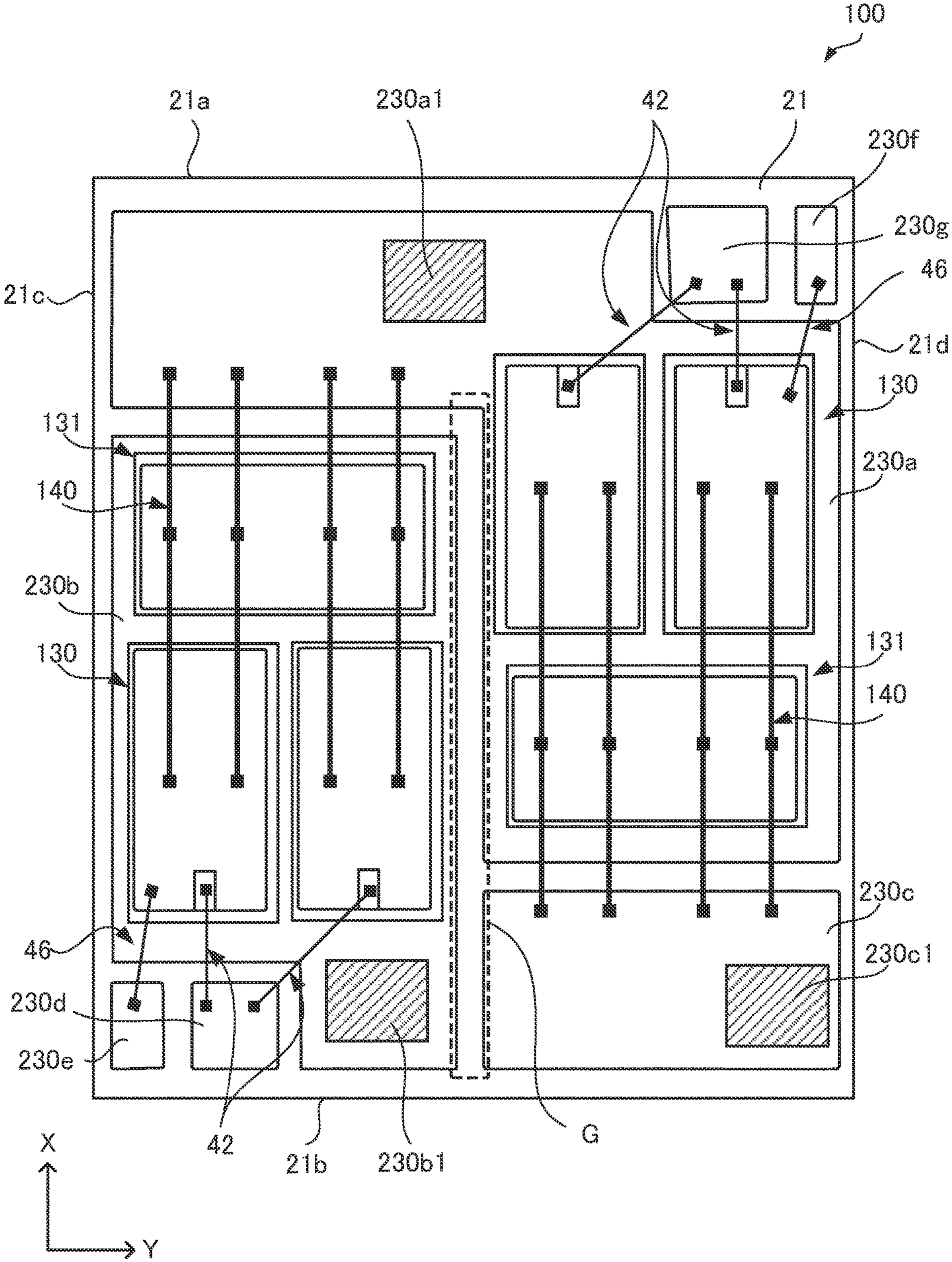
FIG. 7 is a plan view of a semiconductor unit according to a reference example.

Next, in comparison to the semiconductor unit 10, a semiconductor unit according to a reference example will be described with reference to FIG. 7. FIG. 7 is a plan view of a semiconductor unit according to a reference example. Like components between this semiconductor unit 100 illustrated in FIG. 7 and the semiconductor unit 10 are denoted by like reference characters, and description thereof will be omitted. The semiconductor unit 100 includes a ceramic plate 21, circuit patterns 230*a* to 230*g*, and semiconductor chips 130 and 131. The circuit patterns 230*a* to 230*g* are formed to have shapes and are located as illustrated in FIG. 7.

The semiconductor chips 130 each include a switching element, and the semiconductor chips 131 each include a diode element. The individual semiconductor chip 130 as a switching element includes an input electrode on its rear surface and a control electrode and an output electrode on its front surface. The individual semiconductor chip 131 as a diode element includes an output electrode on its rear surface and an input electrode on its front surface.

The circuit pattern 230*a* constitutes a pattern including the connection point E1C2 in FIG. 6. The circuit pattern 230*a* is connected to bonding wires 140 connected to the input electrode of the semiconductor chip 131 disposed on the circuit pattern 230*b*. In addition, the rear surfaces of corresponding semiconductor chips 130 and 131 are bonded to the circuit pattern 230*a* via solder. The circuit pattern 230*a* has an approximately rectangular shape, and an area area 230*a*1 projects in the upper including a contact direction in FIG. 7. The circuit pattern 230*a* is disposed side by side with the circuit pattern 230*b*.

The circuit pattern 230*b* constitutes a pattern including the connection point C1 of the upper arm A in FIG. 6. The rear surfaces of corresponding semiconductor chips 130 and 131 are bonded to the circuit pattern 230*b* via solder. The circuit pattern 230*b* has an area including a contact area 230*b*1, and this area projects in the lower direction in FIG. 7.

The circuit pattern 230*c* constitutes a pattern including the connection point E2 of the lower arm in FIG. 6. The circuit pattern 230*c* is connected to bonding wires 140 connected to the input electrode of the semiconductor chip 131. The circuit pattern 230*c* includes a contact area 230*cl* near the second side 21*b* of the ceramic plate 21.

The circuit pattern 230*d* constitutes a control pattern of the upper arm A. The circuit pattern 230*d* is connected to the control electrodes of corresponding semiconductor chips 130 via control wires 42. The circuit pattern 230*d* is formed near the second side 21*b* of the ceramic plate 21 in FIG. 7.

The circuit pattern 230*g* constitutes a control pattern of the lower arm B. The circuit pattern 230*g* is connected to the control electrodes of corresponding semiconductor chips 130 on the circuit pattern 230*a* via control wires 42. The circuit pattern 230*g* is formed near the first side 21*a* of the ceramic plate 21 in FIG. 7, the first side 21*a* being located in the opposite direction to the second side 21*b* near which the circuit pattern 230*d* is located.

In addition, the circuit patterns 230*e* and 230*f* each constitute a sense pattern. The circuit pattern 230*f* is disposed near the first side 21*a* of the ceramic plate 21, and the circuit pattern 230*e* is disposed near the second side 21*b*, which is located in the opposite direction to the first side 21*a* near which the circuit pattern 230*f* is located. The circuit patterns 230*e* and 230*f* are each mechanically and electrically connected to the output electrode of a corresponding semiconductor chip 130 via a sense wire 46.

In the case of this semiconductor unit 100, a gap G needs to be maintained between the circuit pattern 230*b* of the upper arm A and the circuit pattern 230*a* of the lower arm B. In this way, short-circuiting between the circuit pattern 230*b* and the circuit pattern 230*a* is prevented. That is, in the case of the semiconductor unit 100, since the gap G needs to be maintained, the area of the ceramic plate 21 is increased. Thus, it is difficult to achieve downsizing of the ceramic plate 21, and therefore, downsizing of the semiconductor unit 100 and a semiconductor device including the semiconductor unit 100 become difficult, too.

In contrast, the semiconductor unit 10 includes the semiconductor chips 30 and the ceramic circuit board 20. The individual semiconductor chip 30 has the output electrode 32 and the control electrode 31 on its front surface and has the input electrode on its rear surface. The ceramic circuit board 20 includes the ceramic plate 21 and the circuit patterns 23*b* and 23*a*. The ceramic plate 21 has, in plan view, a rectangular shape surrounded by the first and second sides 21*a* and 21*b* which are located in opposite directions and the third and fourth sides 21*c* and 21*d* which are perpendicular to the first and second sides 21*a* and 21*b* and which are located in opposite directions. The circuit pattern 23*b* is formed on the front surface of the ceramic plate 21. The circuit pattern 23*a* is formed on the front surface of the ceramic plate 21, and the rear surfaces of the semiconductor chips 30 are bonded to the circuit pattern 23*a*. In addition, the circuit pattern 23*b* and the circuit pattern 23*a* are each formed from the third side 21*c* to the fourth side 21*d* and are formed side by side in the main current direction D1 from the first side 21*a* to the second side 21*b*.

By disposing the two semiconductor units 10*a* and 10*b*, each of which corresponds to the semiconductor unit 10, side by side such that their respective main current directions D1 are opposite to each other, and by connecting the two semiconductor units 10*a* and 10*b* with the wires as described above, the semiconductor device 1 is obtained. In this way, the semiconductor device 1 is easily structured by combining the semiconductor units 10 oriented in different directions. Other than the above case, by combining semiconductor units 10 in various ways, various semiconductor devices 1 are structured.

In addition, in the case of the semiconductor device 1, since the semiconductor units 10*a* and 10*b* include their respective ceramic circuit boards 20, the insulating property between the semiconductor units 10*a* and 10*b* is maintained, and short-circuiting between the semiconductor units 10*a* and 10*b* is prevented. Thus, the expansion of the area of the individual ceramic plate 21 is prevented, and expansion of the individual semiconductor unit 10 (the semiconductor unit 10*a* or 10*b*) is prevented. In addition, downsizing of the semiconductor unit 10 is achieved, and downsizing of the semiconductor device 1 is achieved.

Hereinafter, variations of the semiconductor device obtained by combining semiconductor units 10 in various ways will be described.

[Variation 1]

Variation 1 in which two sets of semiconductor units 10*a* and 10*b* illustrated in FIGS. 4 and 5 are connected to each other will be described with reference to FIG. 8.

Figure 8:
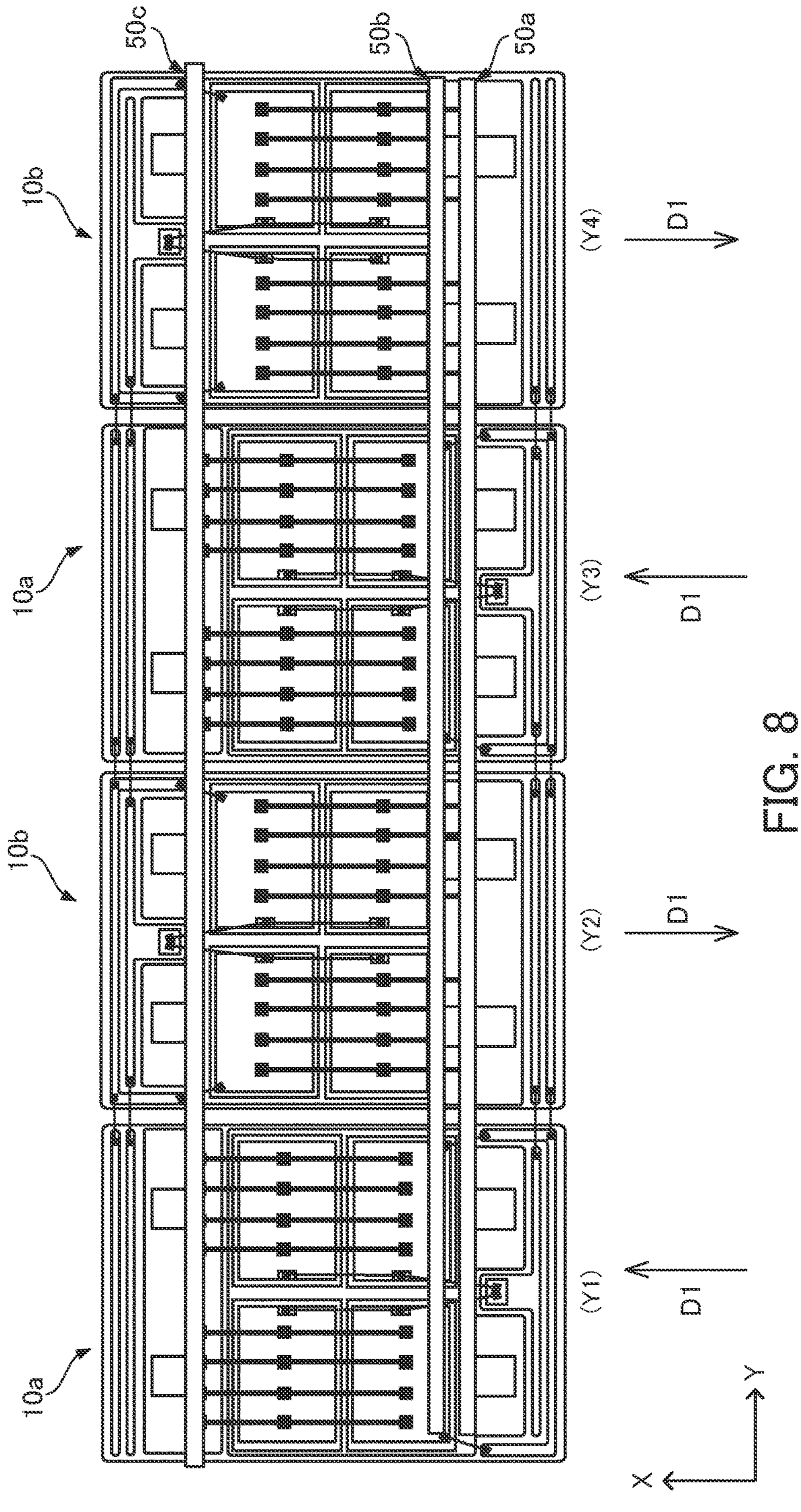
FIG. 8 is a plan view of a semiconductor device according to variation 1 of the first embodiment.

FIG. 8 is a plan view of a semiconductor device according to variation 1 of the first embodiment. Because the semiconductor units 10*a* and 10*b* included in this semiconductor device 1*a* in FIG. 8 are the same as those described with reference to FIGS. 1 to 5, illustration of the reference characters of various components and detailed description of the components will be omitted. In addition, for convenience, the semiconductor units 10*a* and 10*b* of the semiconductor device 1*a* are denoted by Y1 to Y4 in the +Y direction.

As illustrated in FIG. 8, the semiconductor device 1*a* includes two sets of semiconductor units 10*a* and 10*b*. That is, the semiconductor device 1*a* is obtained by connecting the semiconductor units 10*a* and 10*b* (Y3 and Y4) to the semiconductor units 10*a* and 10*b* (Y1 and Y2) included in the semiconductor device 1 in the +Y direction. That is, the semiconductor units 10 are disposed such that the main current direction D1 alternately changes. The semiconductor units 10*b* and 10*a* (Y2 and Y3) are mechanically and electrically connected to each other by the control coupling wires 44*a* and 44*b* and the sense coupling wires 45*a* and 45*b*, as is the case with the semiconductor units 10*a* and 10*b* illustrated in FIG. 4.

In addition, in the case of the semiconductor device 1*a*, the semiconductor units 10*a* and 10*a* (Y1 and Y3) are connected to each other by a busbar 50*a*, and the semiconductor units 10*b* and 10*b* (Y2 and Y4) are connected to each other by a busbar 50*b*. In addition, the semiconductor units 10*a*, 10*b*, 10*a*, and 10*b* (Y1, Y2, Y3, and Y4) are connected to each other by a busbar 50*c*. The busbars 50*a*, 50*b*, and 50*c* connect the semiconductor units 10*a* and 10*b* in the same way as in FIG. 5.

Leg portions 51*a* of the busbar 50*a* are bonded to the input terminal areas 23*a*2 of the circuit patterns 23*a* of the semiconductor units 10*a* and 10*a* (Y1 and Y3). A wiring portion 52*a* is mechanically connected to the leg portions 51*a*. In addition, the wiring portion 52*a* is perpendicular to the main current direction D1 and extends in the +Y directions in FIG. 8. In FIG. 8, part of the wiring portion 52*a* is illustrated. The wiring portion 52*a* may be formed to extend in any direction, depending on the design or specifications of the semiconductor device 1*a*.

Leg portions 51*b* of the busbar 50*b* are also bonded to the output terminal areas 23*b*2 of the circuit patterns 23*b* of the semiconductor units 10*b* and 10*b* (Y2 and Y4). A wiring portion 52*b* is mechanically connected to the leg portions 51*b*. In addition, the wiring portion 52*b* is perpendicular to the main current direction D1 and extends in the +Y directions in FIG. 8. In FIG. 8, part of the wiring portion 52*b* is illustrated. The wiring portion 52*b* may be formed to extend in direction, any depending on the design or specifications of the semiconductor device 1*a*.

Leg portions 51*c* of the busbar 50*c* are also bonded to the output terminal areas 23*b*2 of the circuit patterns 23*b* of the semiconductor units 10*a* (Y1 and Y3) and to the input terminal areas 23*a*2 of the circuit patterns 23*a* of the semiconductor units 10*b* (Y2 and Y4). This bonding of the leg portions 51*c* is also performed by soldering or ultrasonic bonding, for example. In addition, a wiring portion 52*c* is perpendicular to the main current direction D1 and extends in the ±Y directions in FIG. 8. In FIG. 8, part of the wiring portion 52*c* is illustrated. The wiring portion 52*c* may be formed to extend in any direction, depending on the design or specifications of the semiconductor device 1*a*.

The semiconductor device 1*a* according to variation 1 includes two sets of semiconductor units 10*a* and 10*b* connected to each other. As needed, more sets of semiconductor units 10*a* and 10*b* may be connected in the Y direction in FIG. 8.

[Variation 2]

Figure 9:
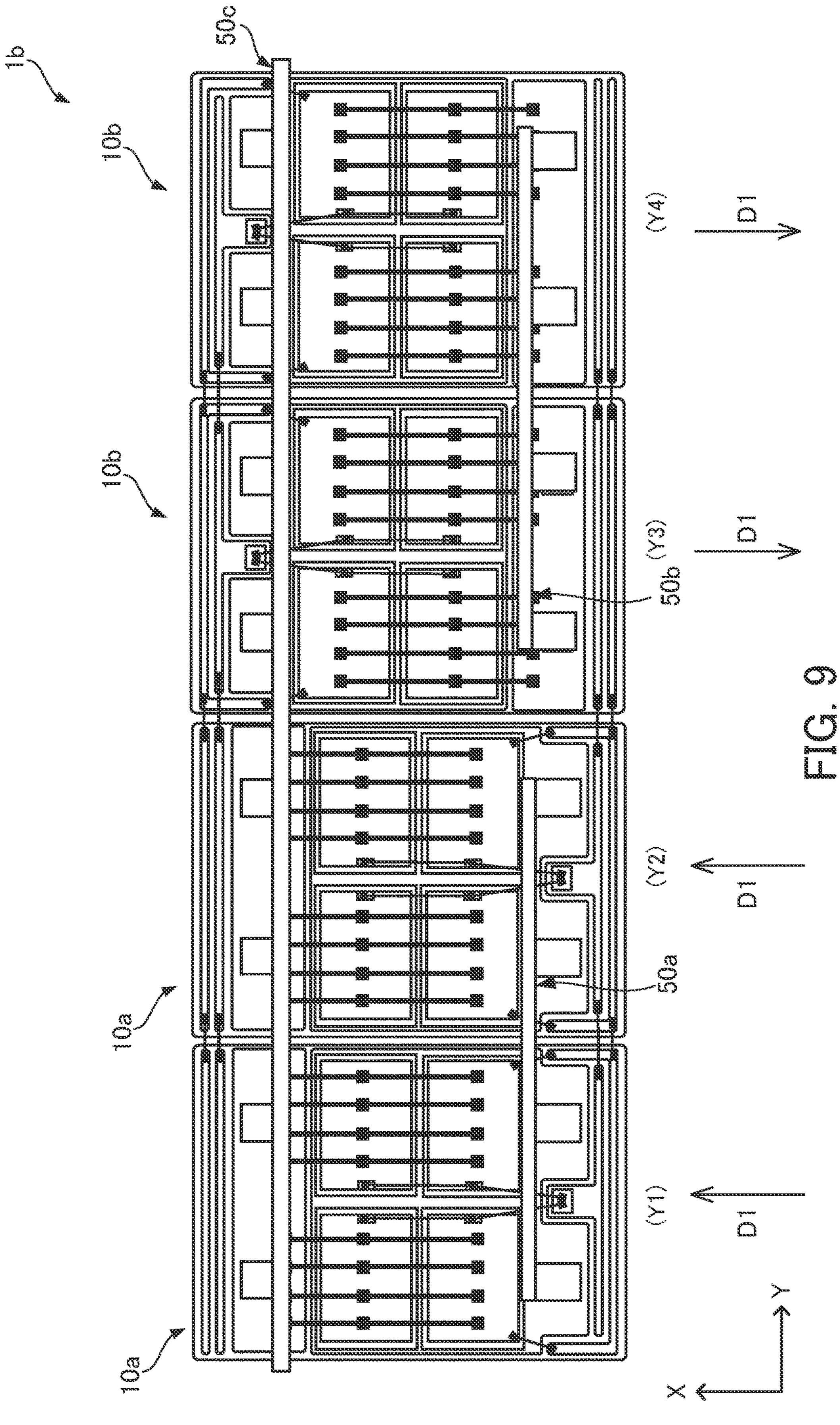
FIG. 9 is a plan view of a semiconductor device according to variation 2 of the first embodiment.

Variation 2 in which semiconductor units 10*a* and 10*b* are connected to the outside of the semiconductor units 10*a* and 10*b* illustrated in FIGS. 4 and 5 will be described with reference to FIG. 9. FIG. 9 is a plan view of a semiconductor device according to variation 2 of the first embodiment. Because the semiconductor units 10*a* and 10*b* included in this semiconductor device 1*b* in FIG. 9 are the same as those described with reference to FIGS. 1 to 5, illustration of the reference characters of various components and detailed description of the components will be omitted. In addition, for convenience, the semiconductor units 10*a* and 10*b* of the semiconductor device 1*b* are denoted by Y1 to Y4 in the +Y direction.

As illustrated in FIG. 9, the semiconductor device 1*b* includes, in addition to the semiconductor units 10*a* and 10*b* (Y2 and Y3) illustrated in FIGS. 1 to 5, a semiconductor unit 10*a* (Y1) in the −Y direction and a semiconductor unit 10*b* (Y4) in the +Y direction. That is, the semiconductor device 1*b* is obtained by connecting the two semiconductor units 10*a* and 10*a* (Y1 and Y2) and the two semiconductor units 10*b* and 10*b* (Y3 and Y4) in a line. The semiconductor units 10*a* and 10*a* (Y1 and Y2) are mechanically and electrically to each other by connecting their respective circuit patterns 23*c*, 23*d*, 23*e*, and 23*f* by wires. The semiconductor units 10*b* and 10*b* (Y3 and Y4) are also mechanically and electrically connected to each other by wires in the same way.

In addition, in the case of the semiconductor device 1*b*, the semiconductor units 10*a* and 10*a* (Y1 and Y2) are connected to each other by a busbar 50*a*, and the semiconductor units 10*b* and 10*b* (Y3 and Y4) are connected to each other by a busbar 50*b*. In addition, the semiconductor units 10*a*, 10*a*, 10*b*, and 10*b* (Y1, Y2, Y3, and Y4) are connected to each other by a busbar 50*c*.

Leg portions 51*a* of the busbar 50*a* are bonded to the input terminal areas 23*a*2 of the circuit patterns 23*a* of the semiconductor units 10*a* and 10*a* (Y1 and Y2). A wiring portion 52*a* is mechanically connected to the leg portions 51*a*. In addition, the wiring portion 52*a* is perpendicular to the main current direction D1 and extends in the +Y directions in FIG. 9. In FIG. 9, part of the wiring portion 52*a* is illustrated. The wiring portion 52*a* may be formed to extend in any direction, depending on the design or specifications of the semiconductor device 1*b*.

Leg portions 51*b* of the busbar 50*b* are bonded to the output terminal areas 23*b*2 of the circuit pattern 23*b* of the semiconductor units 10*b* and 10*b* (Y3 and Y4). A wiring portion 52*b* is mechanically connected to the leg portions 51*b*. In addition, the wiring portion 52*b* is perpendicular to the main current direction D1 and extends in the +Y directions in FIG. 9. In FIG. 9, part of the wiring portion 52*b* is illustrated. The wiring portion 52*b* may be formed to extend in any direction, depending on the design or specifications of the semiconductor device 1*b*.

Leg portions 51*c* of the busbar 50*c* are bonded to the output terminal areas 23*b*2 of the circuit patterns 23*b* of the semiconductor units 10*a* (Y1 and Y2) and to the input terminal areas 23*a*2 of the circuit patterns 23*a* of the semiconductor units 10*b* (Y3 and Y4). This bonding of the leg portions 51*c* also is performed by soldering or ultrasonic bonding, for example. In addition, a wiring portion 52*c* is perpendicular to the main current direction D1 and extends in the ±Y directions in FIG. 9. In FIG. 9, part of the wiring portion 52*c* is illustrated. The wiring portion 52*c* may be formed to extend in any direction, depending on the design or specifications of the semiconductor device 1*b*.

The semiconductor device 1*b* according to variation 2 is formed by connecting a semiconductor unit 10*a* to a set of semiconductor units 10*a* and 10*b* in the −Y direction in FIG. 9 and by connecting a semiconductor unit 10*b* to the set of semiconductor units 10*a* and 10*b* in the +Y direction in FIG. 9. As needed, a plurality of semiconductor units 10*a* may be connected to a set of semiconductor units 10*a* and 10*b* in the −Y direction, and a plurality of semiconductor units 10*b* may be connected to the set of semiconductor units 10*a* and 10*b* in the +Y direction.

[Variation 3]

Figure 10:
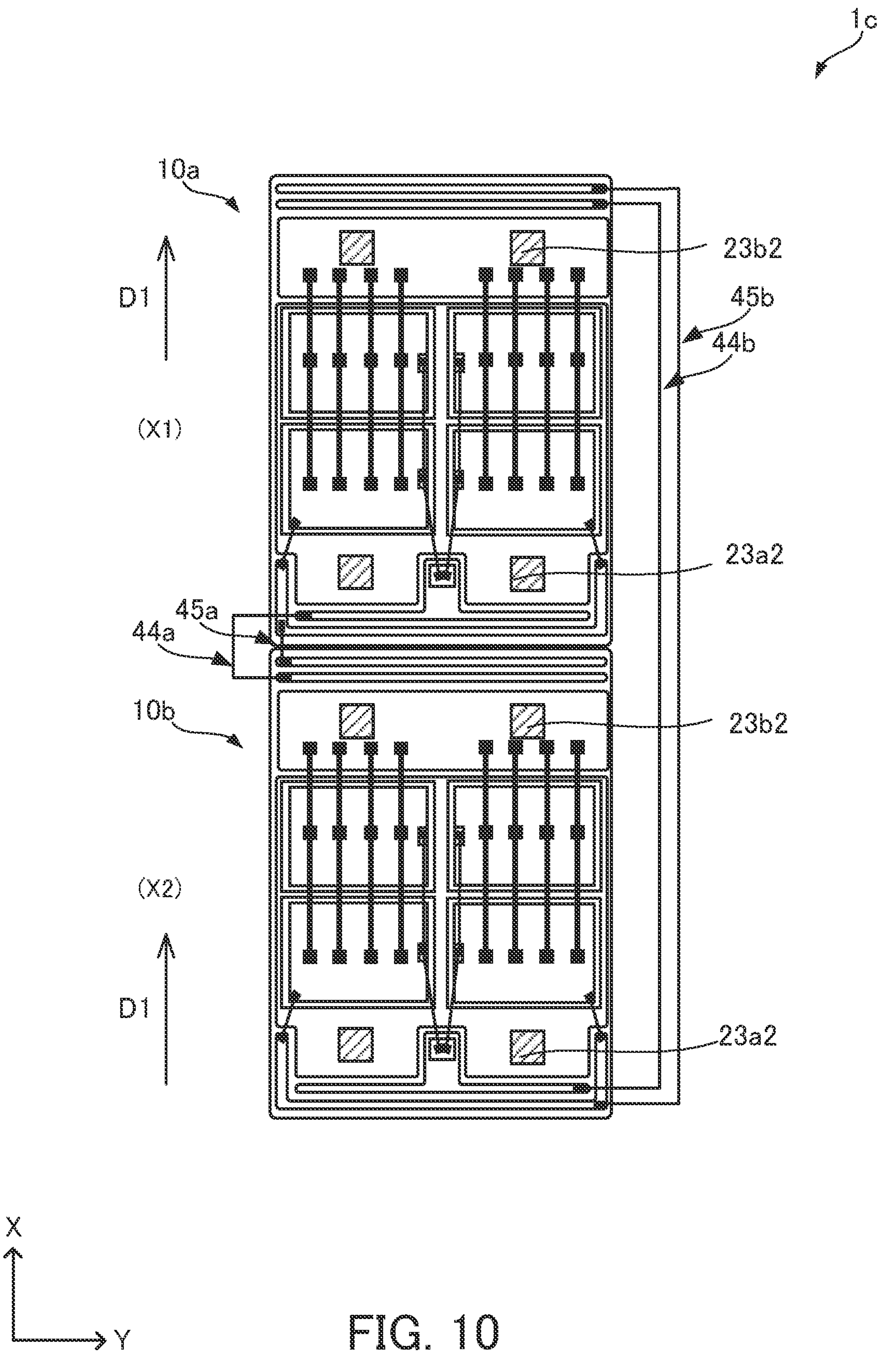
FIG. 10 is a plan view of a semiconductor device according to variation 3 of the first embodiment.
Figure 11:
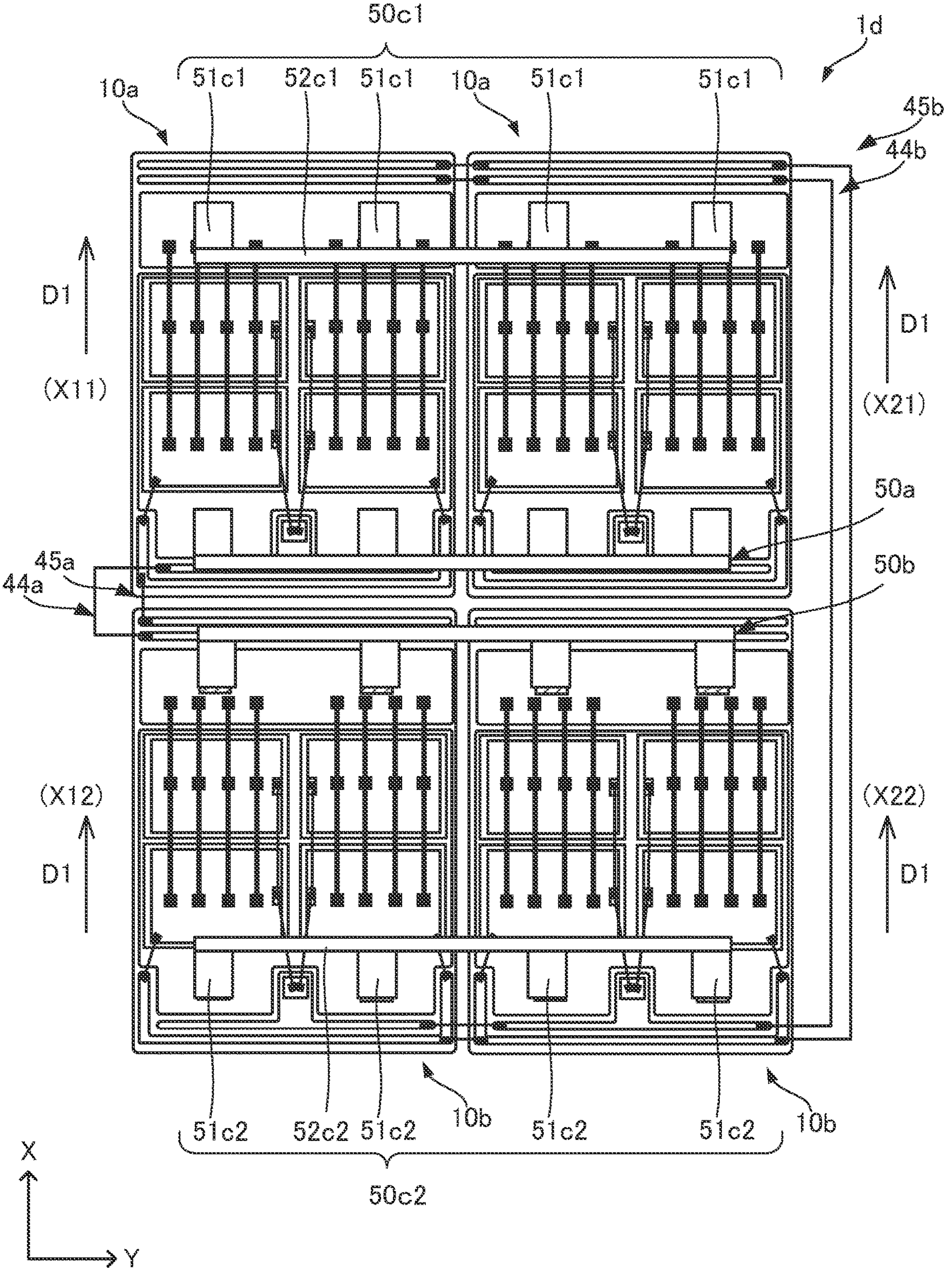
FIG. 11 is a plan view of another semiconductor device according to variation 3 of the first embodiment.

Variation 3 in which the semiconductor units 10*a* and 10*b* illustrated in FIGS. 4 and 5 are disposed vertically (in the X direction) will be described with reference to FIGS. 10 and 11. FIGS. 10 and 11 are each a plan view of a semiconductor device according to variation 3 of the first embodiment. Because the semiconductor units 10*a* and 10*b* included in this semiconductor device 1*c* in FIG. 10 are the same as those described with reference to FIGS. 1 to 5, illustration of the reference characters of various components and detailed description of the components will be omitted. In addition, FIG. 11 illustrates a case in which the semiconductor device 1*c* in FIG. 10 is provided in plurality in the Y direction. In addition, for convenience, the semiconductor units 10*a* and 10*b* of the semiconductor device 1*c* in FIG. 10 are denoted by X1 and X2 in the −X direction. In addition, semiconductor units 10*a* and 10*b* of the semiconductor device 1*d* in FIG. 11 are denoted by 11, X12, X21, and X22 in the −X and +Y directions.

As illustrated in FIG. 10, the semiconductor device 1*c* includes a set of semiconductor units 10*a* and 10*b*. That is, the semiconductor device 1*c* is obtained by disposing the semiconductor units 10*a* and 10*b* (X1 and X2) in a line side by side in parallel to the main current direction D1 and by mechanically and electrically connecting the semiconductor units 10*a* and 10*b* (X1 and X2) to each other. The semiconductor unit 10*a* (X1) and the semiconductor unit 10*b* (X2) have the same main current direction D1 (+X direction).

As is the case with the semiconductor units 10*a* and 10*b* illustrated in FIG. 4, the semiconductor units 10*a* and 10*b* (X1 and X2) are mechanically and electrically connected to each other by the control coupling wires 44*a* and 44*b* and the sense coupling wires 45*a* and 45*b*. In addition, in the case of the semiconductor device 1*c*, busbars 50*a*, 50*b*, and 50*c* may suitably be connected to the semiconductor units 10*a* and 10*b* (see FIG. 11, for example).

The semiconductor units 10*a* and 10*b* of the semiconductor device 1*c* may be structured without the sense coupling circuit patterns 23*e* and the gate coupling circuit patterns 23*f*. In this case, the control coupling wires 44*a* and 44*b* and the sense coupling wires 45*a* and 45*b* are not needed, either. In this way, the individual board area is further reduced, and the size of the semiconductor device 1*c* is further reduced.

In the case of the semiconductor device 1*c*, for example, the input terminal areas 23*a*2 of the semiconductor unit 10*a* are structured to correspond to the connection point C1 in FIG. 6. The output terminal 23*b*2 of the semiconductor unit 10*a* are structured to correspond to the connection point E1C2 in FIG. 6. The input terminal areas 23*a*2 of the semiconductor unit 10*b* are structured to correspond to the connection point E1C2 in FIG. 6. The output terminal areas 23*b*2 of the semiconductor unit 10*b* are structured to correspond to the connection point E2 in FIG. 6. In this way, a half-bridge circuit is formed in the semiconductor device 1*c*. Alternatively, for example, the input terminal areas 23*a*2 of the semiconductor unit 10*b* are structured to correspond to the connection point C1 in FIG. 6. The output terminal areas 23*b*2 of the semiconductor unit 10*b* are structured to correspond to the connection point E1C2 in FIG. 6. The input terminal areas 23*a*2 of the semiconductor unit 10*a* are structured to correspond to the connection point E1C2 in FIG. 6. The output terminal areas 23*b*2 of the semiconductor unit 10*a* are structured to correspond to the connection point E2 in FIG. 6. In this way, a half-bridge circuit is formed.

Alternatively, for example, the input terminal areas 23*a*2 of the semiconductor units 10*a* and 10*b* are structured to correspond to the connection point C1 in FIG. 6. The output terminal areas 23*b*2 of the semiconductor units 10*a* and 10*b* are structured to correspond to the connection point E1C2 in FIG. 6. In this way, a parallel-connected upper arm A is formed. Alternatively, for example, the input terminal areas 23*a*2 of the semiconductor units 10*a* and 10*b* are structured to correspond to the connection point E1C2 in FIG. 6. The output terminal areas 23*b*2 of the semiconductor units 10*a* and 10*b* are structured to correspond to the connection point E2 in FIG. 6. In this way, a parallel-connected lower arm B is formed.

The semiconductor device 1*c* is obtained by connecting a set of semiconductor units 10*a* and 10*b* vertically. As needed, a plurality of sets of semiconductor units 10*a* and 10*b* may be connected to each other in the Y direction in FIG. 10.

For example, the semiconductor device 1*d* illustrated in FIG. 11 is obtained by adding another semiconductor device 1*c* to the above semiconductor device 1*c*. The semiconductor device 1*d* is obtained by disposing another set of semiconductor units 10*a* and 10*b* in the +Y direction of the set of semiconductor units 10*a* and 10*b* illustrated in FIG. 10. That is, in the case of the semiconductor device 1*d*, the Semiconductor units 10*a* and 10*b* (X11 and X12) are disposed vertically in the first column, and the semiconductor units 10*a* and 10*b* (X21 and X22) are disposed vertically in the second column. That is, in the case of the semiconductor device 1*d*, a plurality of semiconductor units 10*a* are disposed in the direction (+Y direction) perpendicular to the main current direction D1, and a plurality of semiconductor units 10*b* are disposed in the direction (+Y direction) perpendicular to the main current direction D1, the plurality of semiconductor units 10*b* facing the plurality of semiconductor units 10*a*. In the case of the semiconductor device 1*d*, the semiconductor units 10*a* and 10*b* (X21 and X22) are mechanically and electrically connected to each other by the control coupling wire 44*b* and the sense coupling wire 45*b*, as Is the case with the semiconductor units 10*a* and 10*b* illustrated in FIG. 10. In addition, the semiconductor units 10*a* and 10*b* (X11 and X12) may be mechanically and electrically connected to each other by the control coupling wire 44*a* and the sense coupling wire 45*a*, as is the case with the semiconductor units 10*a* and 10*b* illustrated in FIG. 10. In addition, the circuit patterns 23*e* of the semiconductor units 10*a* and 10*a* (X11 and X21) are mechanically and electrically connected to each other by a wire. The circuit patterns 23*f* of the semiconductor units 10*a* and 10*a* (X11 and X21) are mechanically and electrically connected to each other by a wire. The circuit patterns 23*c* of the semiconductor units 10*b* and 10*b* (X12 and X22) are mechanically and electrically connected to each other by a wire. The circuit patterns 23*d* of the semiconductor units 10*b* and 10*b* (X12 and X22) are mechanically and electrically connected to each other by a wire.

In addition, in the case of the semiconductor device 1*d*, the semiconductor units 10*a* and 10*a* (X11 and X21) are connected to each other by busbars 50*a* and 50*c*1. In addition, the semiconductor units 10*b* and 10*b* (X12 and X22) are connected to each other by busbars 50*b* and 50*c*2.

Leg portions 51*a* of the busbar 50*a* are bonded to the input terminal areas 23*a*2 of the circuit patterns 23*a* of the semiconductor units 10*a* (X11 and X21). A wiring portion 52*a* is mechanically connected to the leg portions 51*a*. In addition, the wiring portion 52*a* is perpendicular to the main current direction D1 and extends in the ±Y directions in FIG. 11. The wiring portion 52*a* may be formed to extend in any direction, depending on the design or specifications of the semiconductor device 1*d*.

Leg portions 51*b* of the busbar 50*b* are bonded to the output terminal areas 23*b*2 of the circuit patterns 23*b* of the semiconductor units 10*b* (X12 and X22). A wiring portion 52*b* is mechanically connected to the leg portions 51*b*. In addition, the wiring portion 52*b* is perpendicular to the main current direction D1 and extends in the ±Y directions in FIG. 11. The wiring portion 52*b* may be formed to extend in any direction, depending on the design or specifications of the semiconductor device 1*d*.

The busbar 50*cl* includes leg portions 51*c*1 and a wiring portion 52*cl*. The leg portions 51*c*1 are bonded to the output terminal areas 23*b*2 of the circuit patterns 23*b* of the semiconductor units 10*a* (X11 and X21). This bonding of the leg portions 51*c* is also performed by soldering or ultrasonic bonding, for example. In addition, the wiring portion 52*cl* is perpendicular to the main current direction D1 and extends in the ±Y directions in FIG. 11. In FIG. 11, part of the wiring portion 52*cl* is illustrated. The wiring portion 52*c*1 may be formed to extend in any direction, depending on the design or specifications of the semiconductor device 1*d*.

The busbar 50*c*2 includes leg portions 51*c*2 and a wiring portion 52*c*2. The leg portions 51*c*2 are bonded to the input terminal areas 23*a*2 of the circuit patterns 23*a* of the semiconductor units 10*b* (X12 and X22). This bonding of the leg portions 51*c*2 is also performed by soldering or ultrasonic bonding, for example. In addition, the wiring portion 52*c*2 is perpendicular to the main current direction D1 and extends in the ±Y directions in FIG. 11. In FIG. 11, part of the wiring portion 52*c*2 is illustrated. The wiring portion 52*c*2 may be formed to extend in any direction, depending on the design or specifications of the semiconductor device 1*d*.

FIG. 11 illustrates an example in which the semiconductor units 10*a* and 10*b* (X11 and X12) and the semiconductor units 10*a* and 10*b* (X21 and X22) are disposed to have the same main current direction D1 (+X direction). The present embodiment is not limited to this example. The semiconductor units 10*a* and 10*b* may be disposed at (X11 and X12) such that the main current directions D1 thereof are opposite to each other. In addition, the semiconductor units 10*a* and 10*b* may be disposed at (X21 and X22) such that the main current directions D1 thereof are opposite to each other. In other words, the semiconductor units 10*a* may be disposed at (X11 and X21) such that the main current directions D1 thereof match the +X direction, and the semiconductor units 10*b* may be disposed at (X21 and X22) such that the main current directions D1 thereof match the −X direction.

[Variation 4]

Figure 12A:
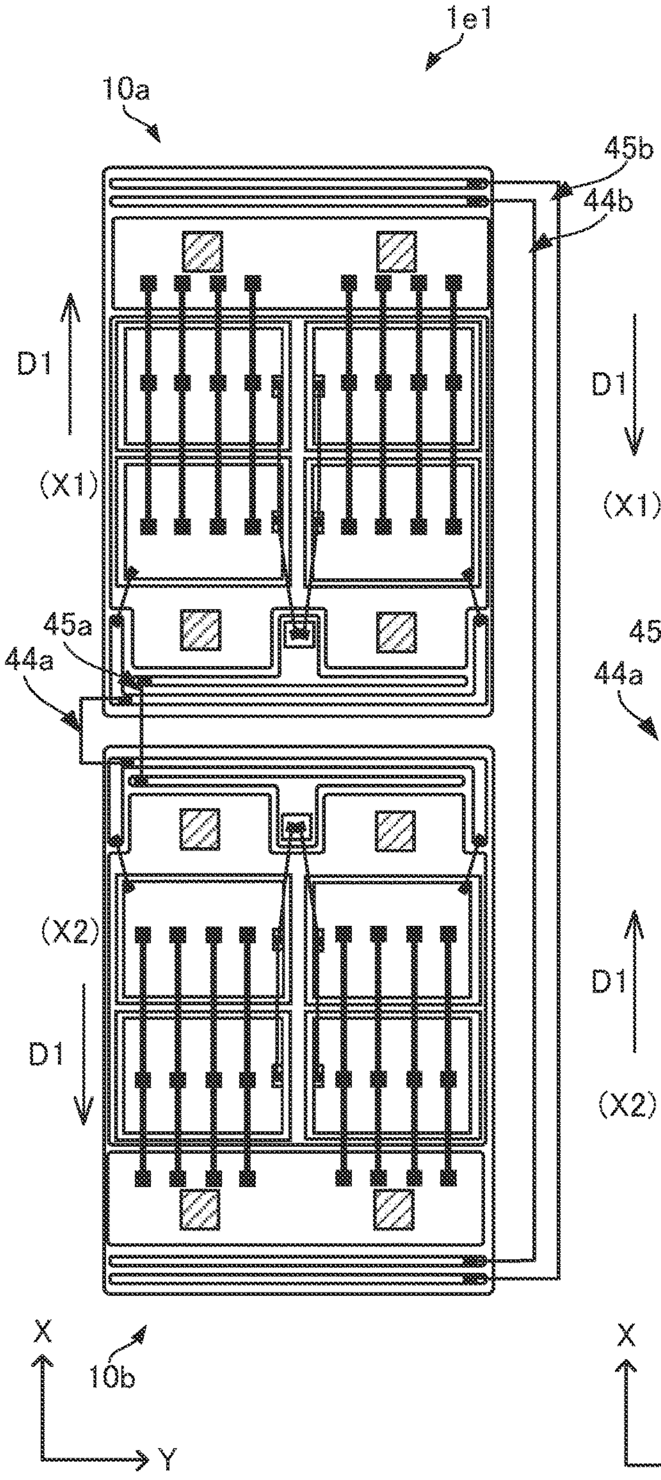
FIGS. 12A and 12B are plan views of semiconductor devices according to variation 4 of the first embodiment.
Figure 12B:
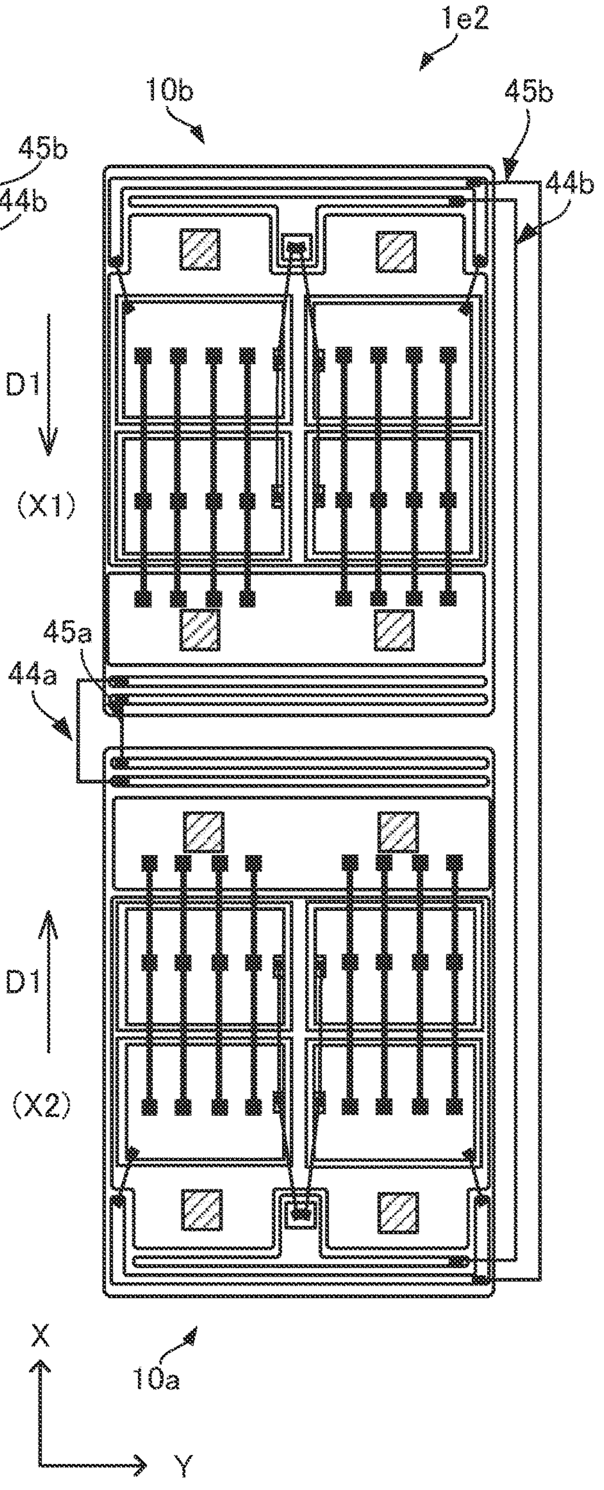
Figure 13:
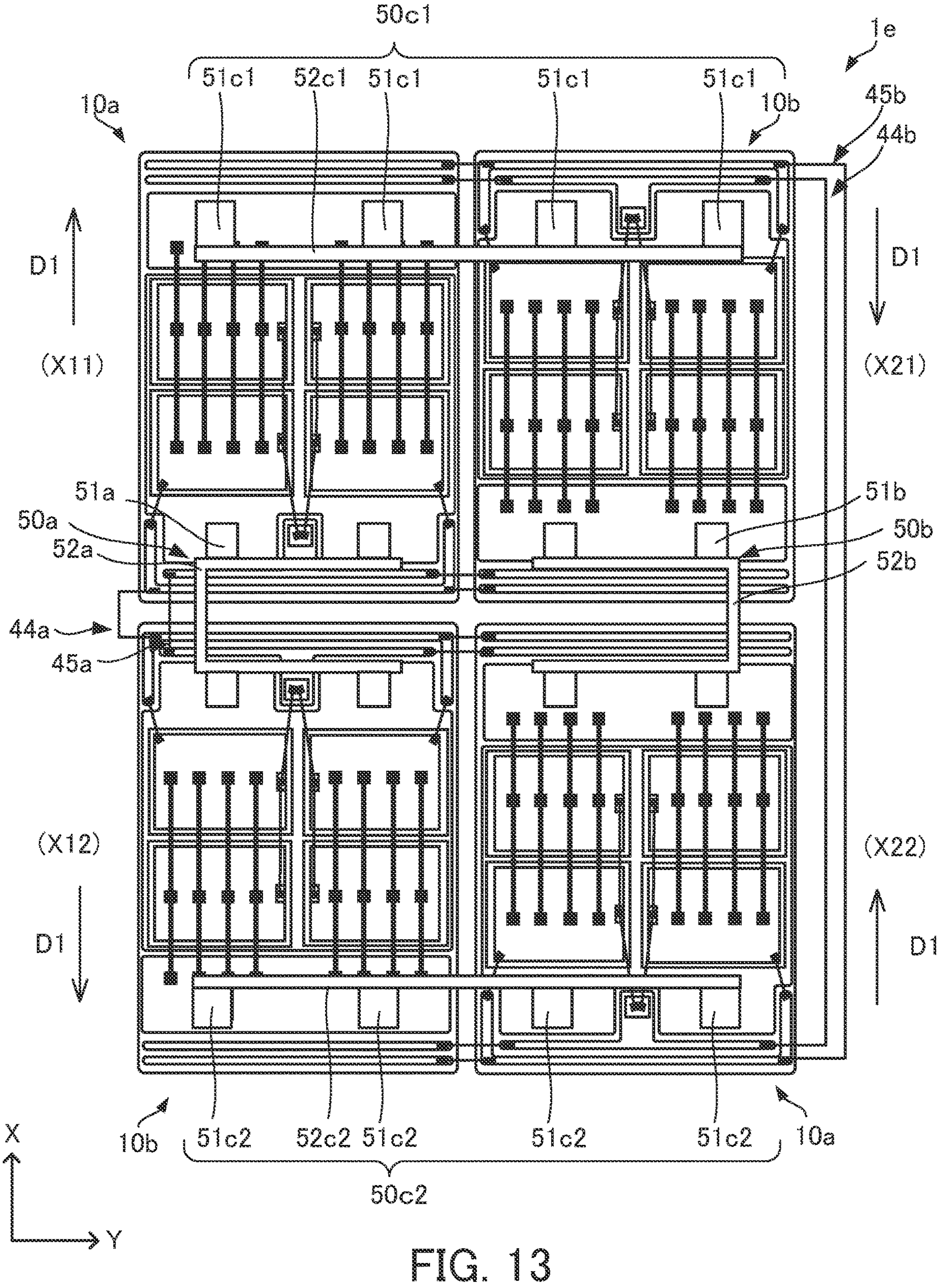
FIG. 13 is a plan view of another semiconductor device according to variation 4 of the first embodiment.

Variation 4 in which the semiconductor units 10 of the semiconductor device 1*c* illustrated in FIG. 10 are disposed in different directions will be described with reference to FIGS. 12A, 12B and 13. FIGS. 12A, 12B and 13 are each a plan view of a semiconductor device according to variation 4 of the first embodiment. Because the semiconductor units 10*a* and 10*b* included in these semiconductor devices 1*e*1 and 1*e*2 in FIGS. 12A and 12B are the same as those described with reference to FIGS. 1 to 5, illustration of the reference characters of various components and detailed description of the components will be omitted. In FIGS. 12A and 12B, no busbars are illustrated. In addition, in FIG. 12A, the semiconductor units 10*a* and 10*b* are disposed in this order in the −X direction, and in FIG. 12B, the semiconductor units 10*b* and 10*a* are disposed in this order in the −X direction. In addition, the semiconductor units are denoted by X1 and X2 in the −X direction. In addition, the semiconductor units 10*a* 10*b* and of the semiconductor device 1*e* in FIG. 13 are denoted by X11, X12, X21, and X22 in the −X and the +Y directions, for convenience.

As illustrated in FIG. 12A, the semiconductor device 1*e*1 includes a set of semiconductor units 10*a* and 10*b*. That is, the semiconductor device 1*e*1 is obtained by disposing the semiconductor units 10*a* and 10*b* (X1 and X2) in a line side by side and by mechanically and electrically connecting the semiconductor units 10*a* and 10*b* (X1 and X2) to each other. The main current direction D1 of the semiconductor unit 10*a* (X1) is opposite to the main current direction D1 of the semiconductor unit 10*b* (X2). That is, the main current direction D1 of the semiconductor unit 10*a* matches the +X direction, and the main current direction D1 of the semiconductor unit 10*b* matches the −X direction.

As is the case with the semiconductor units 10*a* and 10*b* illustrated in FIG. 10, the semiconductor units 10*a* and 10*b* (X1 and X2) may be mechanically and electrically connected to each other by the control coupling wires 44*a* and 44*b* and the sense coupling wires 45*a* and 45*b*. In addition, busbars may be connected to the semiconductor units 10*a* and 10*b* of the semiconductor device 1*e*1 (see FIG. 11, for example).

As illustrated in FIG. 12B, the semiconductor device 1*e*2 includes a set of semiconductor units 10*a* and 10*b*. That is, the semiconductor device 1*e*2 is obtained by disposing the semiconductor units 10*b* and 10*a* (X1 and X2) in a line side by side and by mechanically and electrically connecting the semiconductor units 10*b* and 10*a* (X1 and X2) to each other. The main current direction D1 of the semiconductor unit 10*b* (X1) is opposite to the main current direction D1 of the semiconductor unit 10*a* (X2). That is, the main current direction D1 of the semiconductor unit 10*b* matches the −X direction, and the main current direction D1 of the semiconductor unit 10*a* matches the +X direction.

As is the case with the semiconductor units 10*b* and 10*a* illustrated in FIG. 10, the semiconductor units 10*b* and 10*a* (X1 and X2) may be mechanically and electrically connected to each other by the control coupling wires 44*a* and 44*b* and the sense coupling wires 45*a* and 45*b*. In addition, busbars may be connected to the semiconductor units 10*b* and 10*a* of the semiconductor device 1*e*2 (see FIG. 11, for example).

The semiconductor units 10*a* and 10*b* of the semiconductor devices 1*e*1 and 1*e*2 may be structured without the sense coupling circuit pattern 23*e* and the gate coupling circuit pattern 23*f*. In this case, the control coupling wires 44*a* and 44*b* and the sense coupling wires 45*a* and 45*b* are not needed, either. In this way, the individual board area is further reduced, and the sizes of the semiconductor devices 1*e*1 and 1*e*2 are further reduced.

In addition, in the case of each of the semiconductor devices 1*e*1 and 1*e*2, for example, the input terminal areas 23*a*2 of the semiconductor unit 10*a* are structured to correspond to the connection point C1 in FIG. 6. The output terminal areas 23*b*2 of the semiconductor unit 10*a* are structured to correspond to the connection point E1C2 in FIG. 6. The input terminal areas 23*a*2 of the semiconductor unit 10*b* are structured to correspond to the connection point E1C2 in FIG. 6. The output terminal areas 23*b*2 of the semiconductor unit 10*b* are structured to correspond to the connection point E2 in FIG. 6. In this way, a half-bridge circuit is formed. Alternatively, for example, the input terminal areas 23*a*2 of the semiconductor unit 10*b* are structured to correspond to the connection point C1 in FIG. 6. The output terminal areas 23*b*2 of the semiconductor unit 10*b* are structured to correspond to the connection point E1C2 in FIG. 6. The input terminal areas 23*a*2 of the semiconductor unit 10*a* are structured to correspond to the connection point E1C2 in FIG. 6. The output terminal areas 23*b*2 of the semiconductor unit 10*a* are structured to correspond the connection point E2 in FIG. 6. In this way, a half-bridge circuit is formed.

Alternatively, for example, the input terminal areas 23*a*2 of the semiconductor units 10*a* and 10*b* are structured to correspond to the connection point C1 in FIG. 6. The output terminal areas 23*b*2 of the semiconductor units 10*a* and 10*b* are structured to correspond to the connection point E1C2 in FIG. 6. In this way, a parallel-connected upper arm A is formed. Alternatively, for example, the input terminal areas 23*a*2 of the semiconductor units 10*a* and 10*b* are structured to correspond to the connection point E1C2 in FIG. 6. The output terminal areas 23*b*2 of the semiconductor units 10*a* and 10*b* are structured to correspond to the connection point E2 in FIG. 6. In this way, a parallel-connected lower arm B is formed.

The semiconductor device 1*e*1 or 1*e*2 may be connected in plurality in the Y direction in FIGS. 12A and 12B. As an example of this case, the semiconductor device 1*e* illustrated in FIG. 13 is obtained by disposing the semiconductor devices 1*e*1 and 1*e*2 illustrated in FIGS. 12A and 12B side by side in the +Y direction. That is, the semiconductor device 1*e* is obtained by vertically disposing the semiconductor units 10*a* and 10*b* (X11 and X12) in the first column and vertically disposing the semiconductor units 10*b* and 10*a* (X21 and X22) in the second column. In the case of the semiconductor device 1*e*, the semiconductor units 10*b* and 10*a* (X21 and X22) are mechanically and electrically connected to each other by the control coupling wire 44*b* and the sense coupling wire 45*b*, as is the case with the semiconductor units 10*a* and 10*b* in FIG. 12B. In addition, the semiconductor units 10*a* and 10*b* (X11 and X12) may be mechanically and electrically connected to each other by the control coupling wire 44*a* and the sense coupling wire 45*a*, as is the case with the semiconductor units 10*a* and 10*b* in FIG. 12A. In addition, the semiconductor units 10*a* and 10*b* (X11 and X21) are mechanically and electrically connected to each other by the control coupling wires 44*b* and 44*a* and the sense coupling wires 45*b* and 45*a* as in the case with the semiconductor units 10*a* and 10*b* in FIG. 4. The semiconductor units 10*a* and 10*b* (X12 and X22) are also mechanically and electrically connected to each other by wires.

In addition, in the case of the semiconductor device 1*e*, a busbar 50*a* is connected to the semiconductor units 10*a* and 10*b* (X11 and X12) located in the −Y direction, as illustrated in FIG. 13. In addition, a busbar 50*b* is connected to the semiconductor units 10*a* and 10*b* (X22 and X21) located in the +Y direction. In addition, a busbar 50*c*1 is connected to the semiconductor units 10*a* and 10*b* (X11 and X21) located in the +X direction. In addition, a busbar 50*c*2 is connected to the semiconductor units 10*b* and 10*a* (X12 and X22) located in the −X direction.

Leg portions 51*a* of the busbar 50*a* are bonded to the input terminal areas 23*a*2 of the circuit patterns 23*a* of the semiconductor units 10*a* and 10*b* (X11 and X12) located in the −Y direction. A wiring portion 52*a* is mechanically connected to the leg portions 51*a*. However, the wiring portion 52*a* is formed shape, depending on the locations of the semiconductor units 10*a* and 10*b*.

Leg portions 51*b* of the busbar 50*b* are bonded to the output terminal areas 23*b*2 of the circuit patterns 23*b* of the semiconductor units 10*b* and 10*a* (X21 and X22) located in the +Y direction. A wiring portion 52*b* is mechanically connected to the leg portions 51*b*. This wiring portion 52*b* is also formed in a U shape, depending on the locations of the semiconductor units 10*b* and 10*a*.

Leg portions 51*c*1 of the busbar 50*cl* are bonded to the output terminal areas 23*b*2 of the circuit pattern 23*b* of the semiconductor unit 10*a* (X11) and to the input terminal area 23*a*2 of the circuit patterns 23*a* of the semiconductor unit 10*b* (X21), the semiconductor unit 10*a* (X11) and the semiconductor unit 10*b* (X21) being located in the +X direction. This bonding of the leg portions 51*c* is also performed by soldering or ultrasonic bonding, for example. In addition, a wiring portion 52*cl* is perpendicular to the main current direction D1 and extends in the +Y directions in FIG. 13. In FIG. 13, part of the wiring portion 52*cl* is illustrated. The wiring portion 52*cl* may be formed to extend in any direction, depending on the design or specifications of the semiconductor device 1*e*.

Leg portions 51*c*2 of the busbar 50*c*2 are bonded to the output terminal areas 23*b*2 of the circuit pattern 23*b* of the semiconductor unit 10*b* (X12) and to the input terminal areas 23*a*2 of the circuit pattern 23*a* of the semiconductor unit 10*a* (X22), the semiconductor unit 10*b* (X12) and the semiconductor unit 10*a* (X22) being located in the −X direction. This bonding of the leg portions 51*c*2 is also performed by soldering or ultrasonic bonding, for example. In addition, a wiring portion 52*c*2 is perpendicular to the main current direction D1 and extends in the +Y directions in FIG. 13. In FIG. 13, part of the wiring portion 52*c*2 is illustrated. The wiring portion 52*c*2 may be formed to extend in any direction, depending on the design or specifications of the semiconductor device 1*e*.

[Variation 5]

Figure 14:
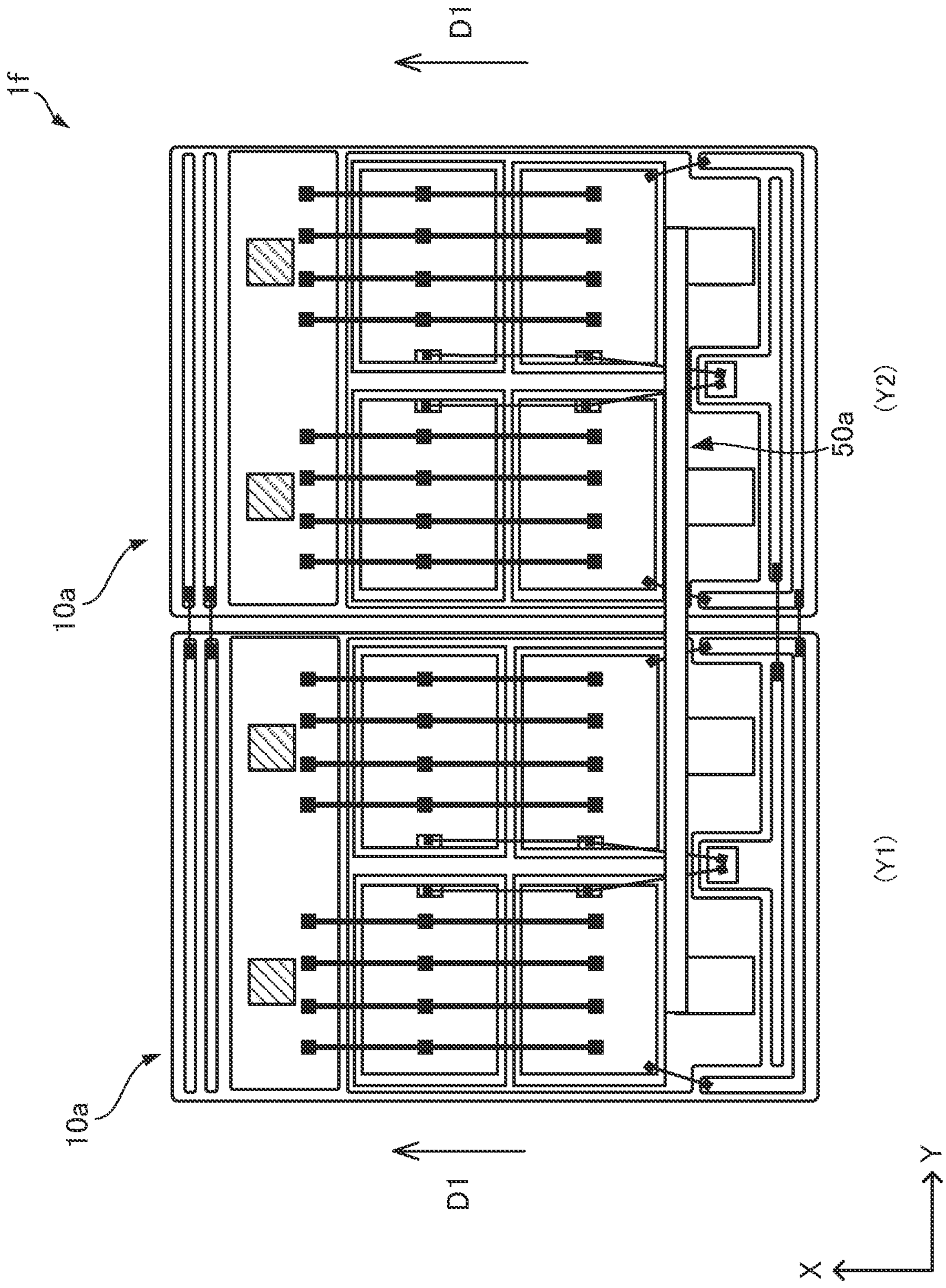
FIG. 14 is a plan view of a semiconductor device according to variation 5 of the first embodiment.
Figure 15:
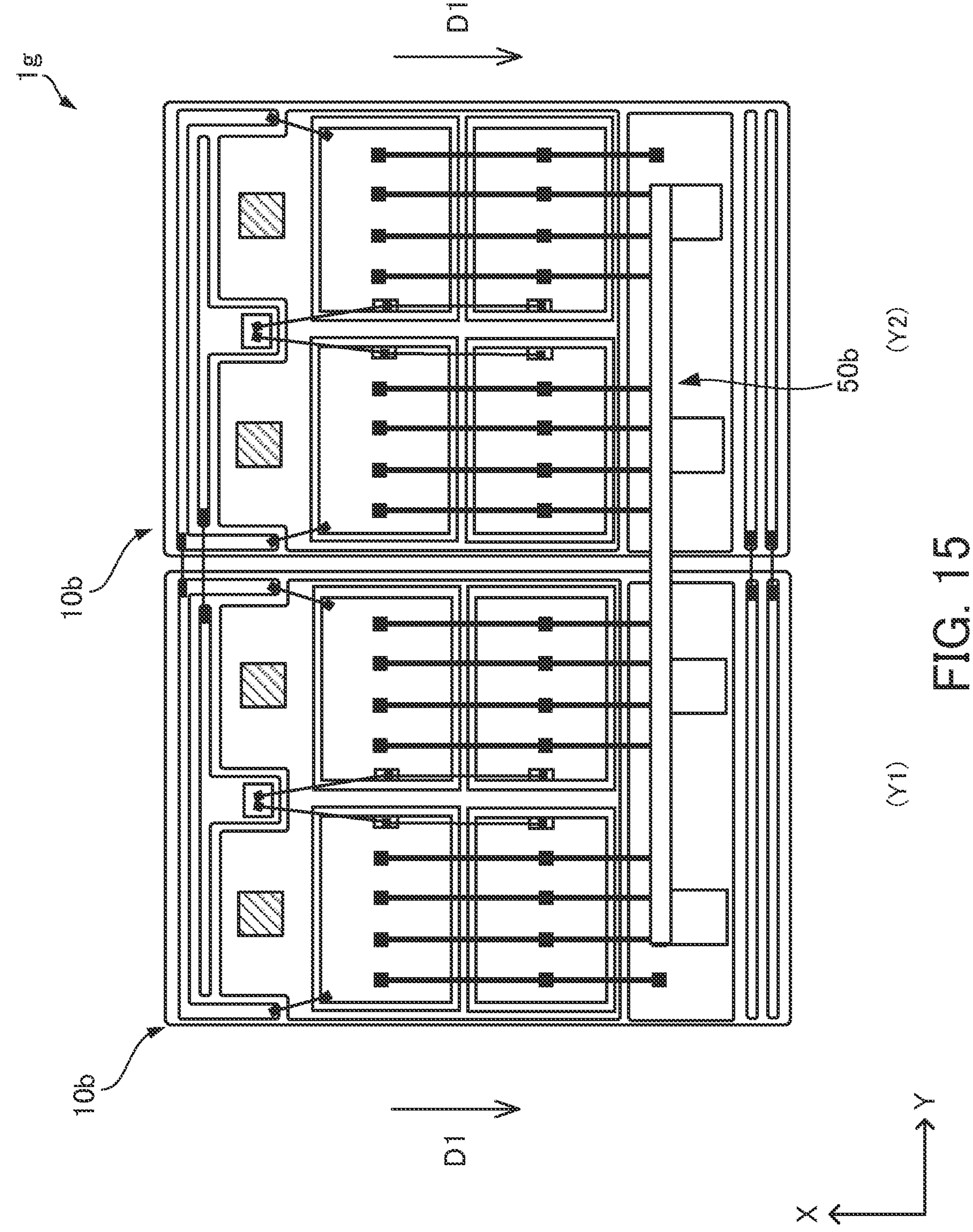
FIG. 15 is a plan view of another semiconductor device according to variation 5 of the first embodiment.

Variation 5 in which the semiconductor unit 10 illustrated in FIG. 1 is provided in plurality and the plurality of semiconductor units 10 having the same main current direction D1 are disposed in the Y direction will be described with reference to FIGS. 14 and 15. FIGS. 14 and 15 are each a plan view of a semiconductor device according to variation 5 of the first embodiment. Because the semiconductor units 10*a* and 10*b* included in these semiconductor devices 1*f* and 1*g* illustrated in FIGS. 14 and 15 are the same as those described with reference to FIGS. 1 to 5, illustration of the reference characters of various components and detailed description of the components will be omitted. In addition, FIG. 14 illustrates a case in which the two semiconductor units 10*a* whose main current directions D1 match the +X direction, one of the semiconductor units 10*a* being included in the semiconductor device 1, are disposed in the Y direction. In addition, FIG. 15 illustrates a case in which the two semiconductor units 10*b* whose main current directions D1 match the −X direction, one of the semiconductor units 10*b* being included in the semiconductor device 1, are disposed in the Y direction. The semiconductor units 10*a* and 10*a* included in the semiconductor device 1*f* are denoted by Y1 and Y2 in the +Y direction, for convenience. In addition, the semiconductor units 10*b* and 10*b* included in the semiconductor device 1*g* are denoted by Y1 and Y2 in the +Y direction, for convenience.

The semiconductor device 1*f* includes the two semiconductor units 10*a* and 10*a* whose main current directions D1 match the +X direction. That is, the semiconductor device 1*f* is obtained by disposing the semiconductor units 10*a* and 10*a* (Y1 and Y2) in a line in the Y direction and by mechanically and electrically connecting the semiconductor units 10*a* and 10*a* (Y1 and Y2) to each other. That is, the semiconductor unit 10*a* (Y2) is disposed adjacent to the semiconductor unit 10*a* (Y1) in the direction (+Y direction) perpendicular to the main current direction D1.

As is the case with the semiconductor units 10*a* and 10*a* (Y1 and Y2) illustrated in FIG. 9, the semiconductor units 10*a* and 10*a* (Y1 and Y2) may be mechanically and electrically connected to each other by the control coupling wires 44*a* and 44*b* and the sense coupling wires 45*a* and 45*b*. In addition, a busbar 50*a* is connected to the semiconductor units 10*a* and 10*b* (Y1 and Y2) of the semiconductor device 1*f*, as in FIG. 9.

The semiconductor device 1*f* as described above is obtained by the semiconductor units 10*a*, each of which has the same main current direction D1. The number of semiconductor units 10*a* included in the semiconductor device 1*f* is not limited to 2. One semiconductor unit 10*a* or three or more semiconductor units 10*a* may be included in the semiconductor device 1*f*.

While the main current direction D1 of the semiconductor device 1*f* matches the +X direction, the main current direction D1 of the semiconductor device 1*g* matches the −X direction, as illustrated in FIG. 15. That is, the semiconductor device 1*g* is obtained by disposing the semiconductor units 10*b* and 10*b* (Y1 and Y2) in a line in the Y direction and by mechanically and electrically connecting the semiconductor units 10*b* and 10*b* (Y1 and Y2) to each other. The semiconductor units 10*b* and 10*b* (Y1 and Y2) may be mechanically and electrically connected to each other by the control coupling wires 44*a* and 44*b* and the sense coupling wires 45*a* and 45*b*, as is the case with the semiconductor units 10*b* and 10*b* (Y3 and Y4) illustrated in FIG. 9. In addition, a busbar 50*b* is connected to the semiconductor units 10*b* and 10*b* (Y1 and Y2) of the semiconductor device 1*g*, as in FIG. 9.

The semiconductor device 1*g* as described above is obtained by the semiconductor units 10*b*, each of which has the same main current direction D1. In addition, the input and output of the semiconductor device 1*g* are opposite to those of the semiconductor device 1*f*. The number of semiconductor units 10*b* included in the semiconductor device 1*g* is not limited to 2. One semiconductor unit 10*b* or three or more semiconductor units 10*b* may be included in the semiconductor device 1*g*. The semiconductor units 10*a* and 10*b* of the semiconductor devices 1*f* and 1*g* may be structured without the sense coupling circuit patterns 23*e* and the gate coupling circuit patterns 23*f*. In this case, the control coupling wires 44*a* and 44*b* and the sense coupling wires 45*a* and 45*b* are not needed, either. In this way, the individual board area is further reduced, and the sizes of the semiconductor devices 1*f* and 1*g* are further reduced.

Second Embodiment

Figure 16:
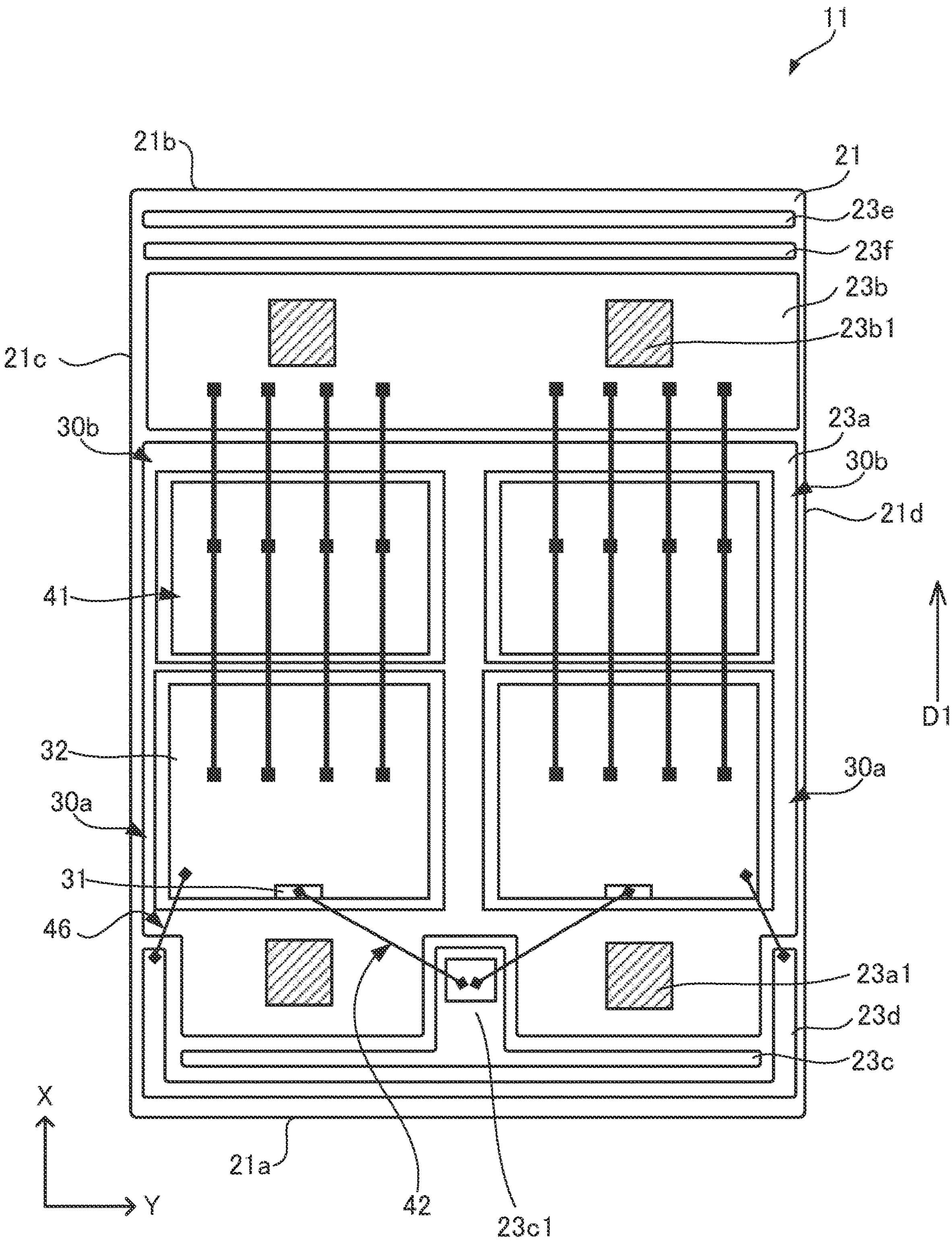
FIG. 16 is a plan view of a semiconductor unit included in a semiconductor device according to a second embodiment.

A second embodiment in which two kinds of semiconductor chips, which are switching elements and diode elements, are used in place of the RC-IGBTs as the semiconductor chips according to the first embodiment will be described with reference to FIG. 16. FIG. 16 is a plan view of a semiconductor unit included in a semiconductor device according to the second embodiment. This semiconductor unit 11 according to the second embodiment includes the same components as those of the above semiconductor unit 10, except for semiconductor chips 30*a* and 30*b*. Thus, like components between the semiconductor unit 11 and the semiconductor unit 10 will be denoted by like reference characters, and description thereof will be simplified or omitted. The semiconductor unit 11 may be structured without the sense coupling circuit pattern 23*e* and the gate coupling circuit pattern 23*f*. In this way, the board area is further reduced.

The semiconductor chips 30*a* and 30*b* are disposed in two columns in the −X direction on the circuit pattern 23*a* of the semiconductor unit 11. Each of the semiconductor chips 30*a* and 30*b* is also made of silicon or silicon carbide as its main component.

The individual semiconductor chip 30*a* is a switching element. The switching element is, for example, an IGBT or a power MOSFET. When the individual semiconductor chip 30*a* is an IGBT, the semiconductor chip 30*a* has an input electrode (a collector electrode) on its rear surface and a control electrode 31 (a gate electrode) and an output electrode 32 (an emitter electrode) on its front surface. When the individual semiconductor chip 30*a* is a power MOSFET, the semiconductor chip 30*a* has an input electrode (a drain electrode) on its rear surface and has a control electrode 31 (a gate electrode) and an output electrode 32 (a source electrode) on its front surface. The rear surface of the individual semiconductor chip 30*a* is mechanically and electrically bonded to the circuit pattern 23*a* via solder. The individual semiconductor chip 30*a* is bonded to the circuit pattern 23*a*, with its control electrode 31 facing in the −X direction. The semiconductor chips 30*a* may be disposed such that their respective control electrodes 31 face each other, as is the case with the semiconductor chips 30 in FIG. 1.

In addition, the individual semiconductor chip 30*b* is a diode element. The diode element is, for example, an FWD such as a Schottky barrier diode (SBD) or a P-intrinsic-N (PIN) diode. The individual semiconductor chip 30*b* has an output electrode (a cathode electrode) on its rear surface and has an input electrode (an anode electrode) on its front surface. The rear surface of the semiconductor chip 30*b* is mechanically and electrically bonded to the circuit pattern 23*a* via solder.

In addition, the main current wires 41 are connected to the output electrodes on the front surfaces of the semiconductor chips 30*a* and to the input electrodes on the front surfaces of the semiconductor chips 30*b* by stitch bonding and are also connected to the circuit pattern 23*b*. The control wires 42 mechanically and electrically connect the contact area 23*cl* located in a center portion of the circuit pattern 23*c* and the control electrodes 31 of the semiconductor chips 30*a*.

A semiconductor device having a half-bridge circuit is obtained by disposing two semiconductor units 11, each of which is the above semiconductor unit 11, in a line in the Y direction such that their respective main current directions D1 are opposite to each other and by connecting these semiconductor units to each other as in FIGS. 4 and 5. In addition, by adjusting the locations and the main current directions D1 of the plurality of semiconductor units 11 as needed, a semiconductor device according to any one of the first embodiment and the variations thereof is easily obtained.

In addition, because the two semiconductor units 11 included in the semiconductor device have their respective ceramic circuit boards 20, the insulating property between the semiconductor units is maintained, and short-circuiting between semiconductor units is prevented. Thus, expansion of the area of the individual ceramic plate 21 is prevented, and expansion of the individual semiconductor unit 11 is thereby prevented. In addition, downsizing of the individual semiconductor unit 11 is achieved, and downsizing of the semiconductor device is achieved.

Third Embodiment

Figure 17:
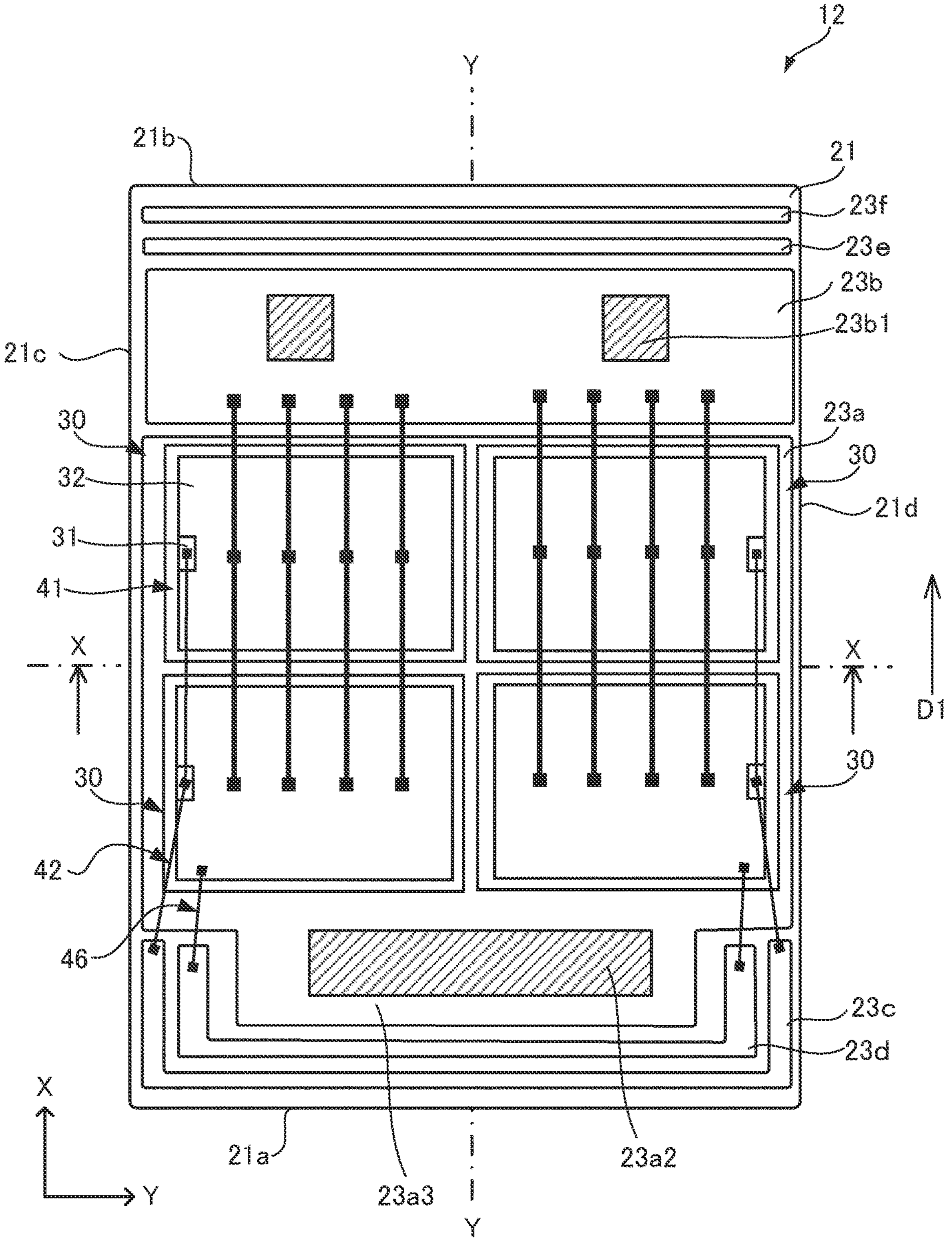
FIG. 17 is a plan view of a semiconductor unit included in a semiconductor device according to a third embodiment.

A third embodiment in which circuit patterns different from those of the semiconductor unit 10 according to the first embodiment are used will be described with reference to FIG. 17. FIG. 17 is a plan view of a semiconductor unit of a semiconductor device according to the third embodiment. This semiconductor unit 12 according to the third embodiment differs from the semiconductor unit 10 in that the shapes of the circuit patterns 23*a* and 23*c* are changed and that the locations of the circuit patterns 23*c* and 23*d* are switched and the locations of the circuit patterns 23*e* and 23*f* are switched. In addition, like components between the semiconductor unit 12 and the semiconductor unit 10 will be denoted by like reference characters, and description thereof will be omitted. Hereinafter, components different from those of the semiconductor unit 10 will be described.

First, the semiconductor chips of the 30 semiconductor unit 12 are bonded to the circuit pattern 23*a*, with their control electrodes 31 facing outside (in the directions of the third and fourth sides 21*c* and 21*d*).

In addition, the circuit pattern 23*a* has an approximately rectangular shape and includes a projecting area 23*a*3 projecting in the lower direction in FIG. 17. The circuit pattern 23*a* is formed to extend from the third side 21*c* to the fourth side 21*d* of the ceramic plate 21. That is, the (−Y direction) end portion of the circuit pattern 23*a* is formed adjacent to the third side 21*c* of the ceramic plate 21, and no other circuit patterns are formed therebetween. The (+Y direction) end portion of the circuit pattern 23*a* is formed adjacent to and face the fourth side 21*d* of the ceramic plate 21, and no other circuit patterns are formed therebetween. The width of the projecting area 23*a*3 in the ±Y direction is less than the width of the circuit pattern 23*a* in the +Y direction. Thus, there is a gap between the −Y direction end portion of the projecting area 23*a*3 and the third side 21*c* of the ceramic plate 21, and there is a gap between the +Y direction end portion of the projecting area 23*a*3 and the fourth side 21*d* of the ceramic plate 21. In addition, the circuit pattern 23*a* includes an input terminal area 23*a*2 in the projecting area 23*a*3.

On the circuit pattern 23*a*, the semiconductor chips 30 are disposed in an area including a center line (a dashed-dotted line X-X). In FIG. 17, two of the four semiconductor chips 30 are disposed above the center line (the dashed-dotted line X-X) (in the +X direction) and the other two semiconductor chips 30 are disposed below the center line (in the −X direction). In addition, the four semiconductor chips are disposed symmetrically with respect to a center line (a dashed-dotted line Y-Y) located between the third side 21*c* and the fourth side 21*d* of the ceramic plate 21. Two of the control electrodes 31 of the semiconductor chips 30 are disposed near the third side 21*c*, and the other two control electrodes 31 are disposed near the fourth side 21*d*. The control electrodes 31 are disposed symmetrically with respect to the center line (the dashed-dotted line Y-Y).

The circuit pattern 23*d* is formed outside and adjacent to the circuit pattern 23*a* (on the side opposite to the main current direction D1). In other words, the circuit pattern 23*d* is provided closer to the first side 21*a* than is the circuit pattern 23*a*. In addition, the circuit pattern 23*d* is formed in a U shape in plan view along the projecting area 23*a*3 of the circuit pattern 23*a*. Two end portions of the circuit pattern 23*d* are mechanically and electrically connected to the output electrodes 32 of the semiconductor chips 30 by sense wires 46. The circuit pattern 23*c* is formed outside and adjacent to the circuit pattern 23*d*. That is, the circuit pattern 23*c* is also formed in a U shape in plan view along the circuit pattern 23*d*. Two end portions of the circuit pattern 23*c* are mechanically and electrically connected to the control electrodes 31 of the semiconductor chips 30 by control wires 42.

In addition, the locations of the circuit pattern 23*e* and the circuit pattern 23*f* of the semiconductor unit 12 are opposite to those of the semiconductor unit 10. That is, the circuit pattern 23*e* (a second sense circuit pattern) may be electrically connected to the output electrodes 32 of the semiconductor chips 30. The circuit pattern 23*e* has a linear shape and is formed outside and adjacent to the circuit pattern 23*b* (in the main current direction D1). In other words, the circuit pattern 23*e* is closer to the second side 21*b* than is the circuit pattern 23*b*. The (+Y direction) end portions of the circuit pattern 23*e* are formed to correspond to the (+Y direction) end portions of the circuit pattern 23*f*. The circuit pattern 23*f* (a second control circuit pattern) may be electrically connected to the control electrodes 31 of the semiconductor chips 30. The circuit pattern 23*f* has a linear shape and is formed outside and adjacent to the circuit pattern 23*e* (in the main current direction D1). The (+Y direction) end portions of the circuit pattern 23*f* are formed to correspond to the (+Y direction) end portions of the circuit pattern 23*b*.

In addition, these circuit patterns 23*d* and 23*e* are formed symmetrically with respect to the center line (the dashed-dotted line X-X) perpendicular to the main current direction D1 of the ceramic circuit board 20. In addition, the circuit patterns 23*d* and 23*e* are equally distanced from the first and second sides 21*a* and 21*b* of the ceramic plate 21, respectively. The semiconductor unit 12 may be structured without the sense coupling circuit pattern 23*e* and the gate coupling circuit pattern 23*f*. In this way, the board area is further reduced.

A semiconductor device having a half-bridge circuit is obtained by disposing two semiconductor units 12, each of which is the above semiconductor unit 12, in a line in the Y direction such that their respective main current directions D1 are opposite to each other and by connecting these semiconductor units to each other as in FIGS. 4 and 5. In addition, by adjusting the locations and the main current directions D1 of these semiconductor units 12, a semiconductor device according to any one of the first embodiment and the variations thereof is easily obtained.

In addition, because the two semiconductor units 12 included in the semiconductor device have their respective ceramic circuit boards 20, the insulating property between the semiconductor units 12 is maintained, and short-circuiting between the semiconductor units 12 is prevented. Thus, expansion of the area of the individual ceramic plate 21 is prevented, and expansion of the individual semiconductor unit 12 is thereby prevented. In addition, downsizing of the individual semiconductor unit 12 is achieved, and downsizing of the semiconductor device is achieved.

According to the technique disclosed herein, because short-circuiting is prevented and expansion of a ceramic plate is reduced, downsizing of a semiconductor unit and a semiconductor device is achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor unit, comprising:

a plurality of semiconductor chips, each of which has an output electrode and a control electrode on a front surface thereof and an input electrode on a rear surface thereof; and an insulated circuit board, including an insulating plate having, in a plan view of the semiconductor unit, a rectangular shape surrounded by a first side and a second side that are opposite to each other, and a third side and a fourth side that are perpendicular to the first side and the second side and opposite to each other, an output circuit pattern provided on a front surface of the insulating plate, and an input circuit pattern provided on the front surface of the insulating plate, and having a chip area extending from the third side to the fourth side, the rear surfaces of the plurality of semiconductor chips being bonded to the input circuit pattern in the chip area, to thereby form a plurality of bonding areas, wherein the output circuit pattern and the input circuit pattern each extend in one direction from the third side to the fourth side, wherein the input circuit pattern is connected to an input terminal via an input terminal area of the input circuit pattern, and the output circuit pattern is connected to an output terminal via an output terminal area of the output circuit pattern, thereby defining a main current direction that is a direction from the input terminal area to the output terminal area, the input circuit pattern and the output circuit pattern being disposed in this order side by side in the main current direction, wherein the input terminal area faces the output terminal area across the chip area, wherein the main current direction is parallel to the third side and the fourth side, wherein the input terminal area, the chip area, and the output terminal area are arranged in this order in the main current direction, wherein the plurality of bonding areas is arranged in a plurality of rows and a plurality of columns, and is aligned in both the main current direction and a predetermined direction perpendicular to the main current direction, wherein the input circuit pattern is connected to the input terminal via another input terminal area of the input circuit pattern, and the output circuit pattern is connected to the output terminal via another output terminal area of the output circuit pattern, wherein the input terminal area overlaps the output terminal area as viewed in the main current direction, wherein the input terminal area overlaps the another input terminal area as viewed in the predetermined direction, wherein the another input terminal area overlaps the another output terminal area as viewed in the main current direction, and wherein the output terminal area overlaps the another output terminal area as viewed in the predetermined direction.

2. The semiconductor unit according to claim 1, further comprising output wiring members extending in the main current direction and connecting the output electrodes and the output circuit pattern.

3. The semiconductor unit according to claim 2, further comprising:

a first control circuit pattern provided on the front surface of the insulating plate closer to the first side than is the input circuit pattern, and being electrically connected to the control electrodes of the plurality of semiconductor chips; and a second control circuit pattern provided on the front surface of the insulating plate closer to the second side than is the output circuit pattern, and being not electrically connected to the control electrodes of the plurality of semiconductor chips.

4. The semiconductor unit according to claim 3, wherein the first control circuit pattern is provided adjacent to the input circuit pattern.

5. The semiconductor unit according to claim 3, further comprising control wiring members extending in the main current direction and connecting the control electrodes and the first control circuit pattern.

6. The semiconductor unit according to claim 3, further comprising:

a first sense circuit pattern provided on the front surface of the insulating plate closer to the first side than is the input circuit pattern, and being electrically connected to the output electrodes of the plurality of semiconductor chips; and a second sense circuit pattern provided on the front surface of the insulating plate closer to the second side than is the output circuit pattern, and being not electrically connected to the output electrodes of the plurality of semiconductor chips.

7. The semiconductor unit according to claim 6, further comprising sense wiring members extending in the main current direction and connecting the output electrodes and the first sense circuit pattern.

8. The semiconductor unit according to claim 6, wherein the first sense circuit pattern and the second sense circuit pattern are equally distanced from a center line that is perpendicular to the main current direction and passes through a center of the insulating plate, and are equally distanced from the first side and the second side, respectively.

9. The semiconductor unit according to claim 6, wherein the first sense circuit pattern is provided closer to the first side than is the first control circuit pattern, and the second sense circuit pattern is provided closer to the second side than is the second control circuit pattern.

10. The semiconductor unit according to claim 6, wherein the input circuit pattern includes two end portions respectively parallel to and facing the third side and the fourth side, and the first control circuit pattern extends from one of the two end portions to the other one of the two end portions, and wherein the first sense circuit pattern has a U shape in the plan view, and is provided between the third side and the fourth side so as to surround the first control circuit pattern.

11. The semiconductor unit according to claim 6, wherein the second control circuit pattern and the second sense circuit pattern each extend from the third side to the fourth side.

12. The semiconductor unit according to claim 3, wherein the first control circuit pattern and the second control circuit pattern are arranged symmetrically with respect to a center line that is perpendicular to the main current direction and passes through a center of the insulating plate, and are equally distanced from the first side and the second side, respectively.

13. The semiconductor unit according to claim 3, wherein the first control circuit pattern is provided adjacent to the input circuit pattern, and the second control circuit pattern is provided adjacent to the output circuit pattern.

14. The semiconductor unit according to claim 1, wherein the input terminal area and the output terminal area are equally distanced from a center line that is perpendicular to the main current direction and passes through a center of the insulating plate, and are approximately equally distanced from the first side and the second side, respectively.

15. The semiconductor unit according to claim 1, wherein the input circuit pattern has a plurality of the input terminal areas provided closer to the first side than are the plurality of semiconductor chips, and wherein the plurality of the input terminal areas are linearly disposed along a line parallel to the first side.

16. The semiconductor unit according to claim 1, wherein the control electrode of each of the plurality of semiconductor chips is disposed at one side of the front surface that extends in the main current direction, and wherein, in two of the plurality of semiconductor chips that are adjacent to each other in a direction perpendicular to the main current direction, the control electrodes are disposed at mutually facing sides or at mutually opposite sides of the two semiconductor chips.

17. A semiconductor device, comprising:

a first arm portion constituted by the semiconductor unit according to claim 1; and a second arm portion constituted by the semiconductor unit according to claim 1, wherein the insulated circuit board of the first arm portion is different from the insulated circuit board of the second arm portion, and wherein the first arm portion and the second arm portion are arranged such that the main current direction of the semiconductor unit that constitutes the first arm portion is opposite to the main current direction of the semiconductor unit that constitutes the second arm portion.

18. The semiconductor device according to claim 17, wherein the fourth side of the first arm portion and the fourth side of the second arm portion are adjacent to and face each other.

19. The semiconductor device according to claim 18, wherein the first arm portion is disposed in plurality along a line perpendicular to the main current direction, and wherein the second arm portion is disposed in plurality along a line perpendicular to the main current direction.

20. The semiconductor device according to claim 17, wherein the first arm portion and the second arm portion are each provided in plurality, the first arm portions being arranged repeatedly and alternating with the second arm portions along a line that is perpendicular to the main current direction.

21. The semiconductor device according to claim 17, wherein each semiconductor unit of the first and second arm portions further includes a first control circuit pattern provided on the front surface of the insulating plate closer to the first side than is the input circuit pattern, and a second control circuit pattern provided on the front surface of the insulating plate closer to the second side than is the output circuit pattern, wherein the first control circuit pattern of the first arm portion and the second control circuit pattern of the second arm portion are electrically connected to each other, and wherein the second control circuit pattern of the first arm portion and the first control circuit pattern of the second arm portion are electrically connected to each other.

22. The semiconductor device according to claim 17, wherein the first arm portion and the second arm portion are adjacent to each other, such that the first side of the first arm portion and the first side of the second arm portion face each other or such that the second side of the first arm portion and the second side of the second arm portion face each other.

23. The semiconductor unit according to claim 1, wherein a center of the chip area overlaps a center of the insulating plate in the plan view.

24. The semiconductor unit according to claim 1, wherein the insulated circuit board further includes a gate circuit pattern formed on the front surface thereof and extending in the one direction perpendicular to the main current direction, the gate circuit pattern including a contact area arranged at a center of the gate circuit pattern in the one direction, and wherein one of the plurality of input terminal connection areas, the contact area, and another of the plurality of input terminal connection areas are arranged in this order in the one direction in the gate circuit pattern.

25. The semiconductor unit according to claim 24, wherein the contact area is mechanically and electrically connected to the control electrodes of the semiconductor chips by control wires that extend in the main current direction.

26. The semiconductor unit according to claim 24, wherein the plurality of bonding areas is symmetrical with respect to a line of symmetry that is a center line of the insulating plate perpendicular to the main current direction.

* * * * *